United States Patent [19]
Shimada

[11] Patent Number: 5,705,877
[45] Date of Patent: Jan. 6, 1998

[54] PIEZOELECTRIC TRANSFORMER DRIVING CIRCUIT

[75] Inventor: Yasuhei Shimada, Tokyo, Japan

[73] Assignee: NEC Corporation, Tokyo, Japan

[21] Appl. No.: 732,575

[22] Filed: Oct. 15, 1996

[30] Foreign Application Priority Data

Oct. 12, 1995 [JP] Japan ................... 7-264081

[51] Int. Cl.$^6$ .............................................. H01L 41/08
[52] U.S. Cl. .............................................. 310/318
[58] Field of Search ................................. 310/314, 316, 310/318, 319; 323/355, 358

[56] References Cited

U.S. PATENT DOCUMENTS

| | | | |
|---|---|---|---|
| 3,778,648 | 12/1973 | Kawada ................... | 310/318 |
| 4,054,936 | 10/1977 | Ansai et al. ............... | 361/257 |
| 5,329,200 | 7/1994 | Zaitsu ....................... | 310/316 |
| 5,424,935 | 6/1995 | Wu ............................ | 363/97 |

FOREIGN PATENT DOCUMENTS 4-210773  7/1992  Japan.

OTHER PUBLICATIONS

Tagami et al., "Color-LCD Backlight Inverter Utilizing Piezoelectric Ceramic Transformer", *Society for Information Display*, 1995 International Symposium, Seminar and Exhibition, May 21-26, 1995, pp. 1-5.

Kawashima et al., "Third Order Longitudinal Mode Piezoelectric Ceramic Transformer and Its Application to High-Voltage Power Inverter", 1994 *IEEE International Ultrasonics Symposium*, Nov. 1-4, 1994, pp. 1-12.

*Primary Examiner*—Matthew V. Nguyen
*Attorney, Agent, or Firm*—Sughrue, Mion, Zinn, Macpeak & Seas, PLLC

[57] ABSTRACT

A piezoelectric transformer driving circuit includes a boosting circuit receiving an input DC voltage to generate an AC voltage for driving a piezoelectric transformer, a frequency control circuit for controlling the frequency of the AC voltage applied to the piezoelectric transformer to control a step-up ratio of the piezoelectric transformer, and a drive voltage control circuit for controlling the voltage of the AC voltage applied to the piezoelectric transformer at a predetermined level, regardless of variation of the input DC voltage.

20 Claims, 14 Drawing Sheets

PIEZOELECTRIC TRANSFORMER DRIVING CIRCUIT

BACKGROUND OF THE INVENTION

1. Field of the invention

The present invention relates to a circuit for driving a piezoelectric transformer performing a voltage-to-voltage conversion by utilizing a piezoelectric element, and more specifically to a piezoelectric transformer driving circuit capable of realizing a high conversion efficiency even if an input voltage varies in a wide range.

2. Description of related art

In general, a piezoelectric transformer can be said to be a voltage-to-voltage converter so configured that a mechanical vibration is caused in piezoelectric element by applying a voltage between primary electrodes, and a different voltage is picked up from secondary electrodes by action of a piezoelectric effect of the piezoelectric element. The piezoelectric transformer is featured in that it is easily scaled down and thinned in comparison with an electromagnetic transformer, and is used as an inverter for lighting a cold-cathode fluorescent lamp (one kind of cold-cathode tube) and attracts attentions as a high voltage power source.

The present invention is directed to a driving circuit for this piezoelectric transformer, which is used as an inverter for converting a DC voltage to an AC high voltage or a DC-to-DC converter for converting a DC voltage to a DC high voltage. For example, in the case that the piezoelectric transformer is used in a power source for a back light incorporated in a 9.4-inch color liquid crystal display unit, if a load is a cold-cathode fluorescent lamp (cold-cathode tube) having a tube length of 220 mm and a tube diameter of 3 mmφ, the inverter is required to convert a DC voltage in the range of 5 V to 20 V, to an AC power of a lamp voltage of about 500 Vrms (the suffix "rms" indicates a root-mean-square value), a lamp current of about 5 mArms and a frequency of 100 kHz. In the case that the piezoelectric transformer is used as a power supply for generating a static electricity in a laser printer, it is necessary to obtain a DC voltage on the order of 1 kV to 5 kV from a DC power supply on the order of 24 V.

In Japanese Patent Application No. Heisei 7-069207 filed on Mar. 28, 1995 and its corresponding U.S. patent application Ser. No. 08/623,028 (the disclosure of which is incorporated by reference in its entirety into this application), the inventor of this application has proposed one piezoelectric transformer driving circuit, a block diagram of which is shown in FIG. 1.

The piezoelectric transformer driving circuit shown in FIG. 1, comprises a piezoelectric transformer 1 having a pair of primary electrodes and a pair of secondary electrodes, a load 2 connected to the secondary electrodes of the piezoelectric transformer 1, a step-up or boosting circuit 4 connected to the primary electrodes of the piezoelectric transformer 1 for driving the piezoelectric transformer 1 with an AC voltage, and a frequency control circuit 3 connected to the load 2 (or the secondary electrodes of the piezoelectric transformer 1) and for controlling the boosting circuit 4 to the effect that the piezoelectric transformer 1 is driven at or near a resonance frequency of a piezoelectric element so that an output is controlled at a constant level. This piezoelectric transformer driving circuit is an inverter receiving a input DC voltage VDD and supplying an AC output voltage VO(Vrms) to the load 2.

With this arrangement, if a driving voltage of a sine wave having the resonance frequency is applied to the primary electrodes of the piezoelectric transformer 1, the piezoelectric transformer causes a mechanical vibration. The piezoelectric transformer 1 has a step-up ratio determined by a shape of the piezoelectric transformer, and therefore, the AC voltage elevated by the step-up ratio can be obtained from the secondary electrodes of the piezoelectric transformer 1.

Referring to FIG. 2, there is shown an equivalent circuit of a part composed of the piezoelectric transformer 1, the boosting circuit 4 and the load 2, in the circuit shown in FIG. 1. The piezoelectric transformer 1 can be considered to be constituted of a resonance circuit of series-connected inductor L, capacitor C and resistor R and an ideal transformer T, and to receive a drive voltage supplied from the primary electrodes, and to output from the secondary electrodes a voltage stepped up with a step-up ratio AV. In the case that the piezoelectric transformer 1 is driven with a frequency other than the resonance frequency, a parasitic vibration occurs in the piezoelectric transformer 1, but only a component of the resonance frequency can be extracted from the secondary electrodes, with the result that the conversion efficiency of the piezoelectric transformer 1 drops because of an energy loss. Therefore, it is important to drive the piezoelectric transformer 1 with a sine wave containing no component other than the resonance frequency. In addition, since it is possible to generate a sine wave having a voltage higher than an input power source voltage, by use of a coil or an electromagnetic transformer, the piezoelectric transformer driving circuit can be advantageously driven with a lower input voltage.

Under the above mentioned circumstance, the boosting circuit 4 shown in FIG. 1 is so configured that a sine wave is generated with a resonance between an inductance of the electromagnetic transformer and a capacitance of the piezoelectric transformer and the piezoelectric transformer itself is driven with the generated sine wave. In brief, the primary electrodes of the piezoelectric transformer 1 are connected to electromagnetic transformers T1 and T2, respectively, in the form of an autotransformer, and a pair of complementary clocks generated by a 2-phase pulse generator 9 are supplied to a pair of transistors Q1 and Q2, respectively, so as to alternately turn on the transistors Q1 and Q2, so that a primary winding of the electromagnetic transformers T1 and T2 are alternately supplied with an electric current from a DC power source VDD, with the result that the primary winding of the electromagnetic transformers T1 and T2 alternately accumulate an electromagnetic energy.

When each of the transistors Q1 and Q2 is turned off, the accumulated electromagnetic energy is discharged to generate a voltage higher than the input DC power source voltage. In the equivalent circuit shown in FIG. 2, it is so designed that each transformer causes a voltage resonance (series resonance) in cooperation with an input equivalent capacitance Cd1 of the primary electrode of the piezoelectric transformer 1, and a half-wave sine wave having a peak voltage of about three times of the input DC power source voltage VDD is generated. Half-wave sine waves Vd1(Vo-p) (the suffix "o-p" indicates a zero-to-peak value) and Vd2 (Vo-p) generated in the electromagnetic transformers T1 and T2 are stepped up by the secondary winding of the electromagnetic transformers T1 and T2 to similar half-wave sine waves VS1(Vo-p) and VS2(Vo-p), respectively, which are turn-ratio "N+1" times of Vd1(Vo-p) and Vd2(Vo-p). These half-wave sine waves VS1(Vo-p) and VS2(Vo-p) are supplied to the primary electrodes of the piezoelectric transformer 1.

These two half-wave sine waves VS1(Vo-p) and VS2(Vo-p), which are opposite to each other in phase, equivalently becomes one full-wave sine wave having an amplitude of VS1+VS2(Vp-p) (the suffix "p-p" indicates a peak-to-peak value), which in turn vibrates the piezoelectric transformer 1, with the result that the secondary electrodes of the piezoelectric transformer 1 generates a stepped-up AC voltage VO(Vrms), which is determined by the shape of the piezoelectric transformer 1.

The AC voltage VO(Vrms) thus generated is applied to the load 2, so that an AC current IO(mArms) (or alternatively, AC voltage VO(Vrms)) is supplied to the frequency control circuit 3. This frequency control circuit 3 is configured to generate a driving frequency for the piezoelectric transformer 1, to be supplied to the 2-phase pulse generator 9, and to continue to sweep the driving frequency until the AC current IO(mArms) (or alternatively, AC voltage VO(Vrms)) outputted from the piezoelectric transformer 1 reaches a predetermined value, and to stop its sweeping when the AC current IO(mArms) (or alternatively, AC voltage VO(Vrms)) becomes the predetermined value.

As shown in FIG. 1, the frequency control circuit 3 comprises a current-to-voltage converter 10 receiving the AC current IO(mArms), a rectifying circuit 11 receiving an output of current-to-voltage converter 10 (or alternatively the AC voltage VO(Vrms) directly from the piezoelectric transformer 1), an comparator 12 for comparing an output of the rectifying circuit 12 with a reference voltage Vref, an integrating circuit 13 receiving an output of the comparator 12, a voltage controlled oscillator (VCO) 15 receiving an output of the integrating circuit 13, and another integrating circuit 14 receiving the output of the integrating circuit 13 and having an output connected to a control input of the integrating circuit 13.

With this arrangement, the AC current IO(mArms) flowing through the load 2 is converted by the current-to-voltage converter 10 into a voltage signal, which is in mm rectified by the rectifying circuit 11 to a DC detection signal. This DC detection signal is compared with the reference voltage Vref by the comparator 12. When the DC detection signal is smaller than the reference voltage Vref, the comparator 12 outputs a high level signal to the integrating circuit 13, and on the other hand, the integrating circuit 13 is configured to continuously drop its output voltage at a constant rate during a period in which the integrating circuit 13 receives the high level signal. The output voltage of the integrating circuit 13 is applied to the VCO 15, which generates a pulse having a frequency in proportion to the received voltage. This pulse is supplied to the 2-phase pulse generator 9 so that the piezoelectric transformer 1 is driven with the frequency of the VCO 15. Therefore, when the DC detection signal is smaller than the reference voltage Vref, the driving frequency continues to drop.

The following is the reason for sweeping the driving frequency from a high frequency side to a low frequency side. It is constructed to use a frequency region higher than the resonance frequency "fr" of the piezoelectric transformer 1. On the other hand, it is also designed that if the detection signal outputted from the rectifying circuit 11 is lower than the reference voltage Vref, the driving frequency drops. The closer the driving frequency becomes to the resonance frequency "fr", the step-up ratio of the piezoelectric transformer 1 increases, and therefore, the AC current IO (mArms) (or alternatively, the AC voltage VO (Vrms)) continues to increase. In this condition, when the voltage applied to the comparator 12 exceeds the reference voltage Vref, the output of the comparator 12 becomes the low level, which in turn causes the integrating circuit 13 to stop its integration operation. Thereafter, the output of the integrating circuit 13 is maintained at a voltage level just before the output of the comparator 12 becomes the low level. Accordingly, the output frequency of the VCO 15 becomes a constant, and therefore, the piezoelectric transformer 1 is driven with a constant driving frequency, so that the AC current IO (mArms) (or alternatively, the AC voltage VO (Vrms)) supplied from the piezoelectric transformer 1 is maintained at a constant level.

When the input DC voltage VDD is smaller than a rated voltage, or during a period until a cold-cathode fluorescent lamp (cold-cathode tube) connected as the load 2 starts to discharge, a predetermined AC current IO (mArms) (or AC voltage VO (Vrms)) cannot be supplied to the load 2. In this situation, the driving frequency of the VCO 15 drops lower than the resonance frequency of the piezoelectric transformer. Thereafter, when the input DC voltage VDD reaches the rated voltage or more, or when the cold-cathode fluorescent lamp starts to actually discharge, the step-up ratio of the piezoelectric transformer 1 is not sufficient, so that a necessary electric power cannot be supplied to the load 2. Accordingly, when the driving frequency dropped to a minimum frequency of the VCO 15, it is necessary to return the driving frequency to a frequency region which is higher than the resonance frequency of the piezoelectric transformer 1. An operation for this purpose will be described in the following:

If it is not possible to supply the predetermined AC current IO (mArms) (or AC voltage VO (Vrms)) to the load 2, the output of the comparator 12 remains at the high level, which causes the driving frequency to continue to drop. If the output voltage of the integrating circuit 13 becomes lower than a minimum reference voltage Vmin which is set to correspond to the minimum frequency of the VCO 15, the comparator 14 outputs a reset signal of a high level to the integrating circuit 13. In response to this reset signal, the output voltage of the integrating circuit 13 is brought to a maximum voltage, which corresponds to a maximum frequency of the VCO 15. As a result, the driving frequency becomes the maximum frequency of the VCO 15, and the above mentioned operation will be repeated until the predetermined AC current IO (mArms) (or AC voltage VO (Vrms)) is supplied to the load 2.

Thus, when the input DC voltage VDD recovers the rated voltage or more, or when the cold-cathode fluorescent lamp connected as the load 2 starts to discharge, it is possible to supply the predetermined electric power.

As mentioned above, when the input DC voltage VDD is not less than the rated voltage, since the constant AC current IO (mArms) (or AC voltage VO (Vrms)) is supplied to the load 2, it is possible to supply the constant AC current IO (mArms) (or AC voltage VO (Vrms)) to the load 2, regardless of variations of the ambient temperature, the power source voltage and the load.

Referring to FIG. 3, there is shown a block diagram of a prior art example of the DC-to-DC converter using a piezoelectric transformer, which is disclosed in Japanese Patent Application Pre-examination Publication No. JP-A-4-210733.

As shown in FIG. 3, a DC voltage supplied from a DC power source 30 is supplied to a primary electrode driving circuit 31, which generates an AC voltage for driving primary electrodes of a piezoelectric transformer 1. Thus, secondary electrodes of the piezoelectric transformer 1 output a stepped-up AC voltage to an output rectifying circuit 32, which in mm supplies a rectified DC voltage to a load 2. Furthermore, the rectified DC voltage is also supplied to a detecting and amplifying circuit 35, which in turn supplies a detected and amplified signal to a variable frequency oscillator 33 so as to adjust an oscillation frequency of the variable frequency oscillator 33 supplied to the primary electrode driving circuit 31. Thus, by adjusting the driving frequency of the piezoelectric transformer 1, the step-up ratio of the piezoelectric transformer 1 is adjusted. In the above mentioned feedback loop, the DC voltage supplied to the load is stabilized.

The primary electrode driving circuit 31 shown in FIG. 3 adopts a resonance type converter configured to carry out a zero-voltage switching (ZVS) of the drive voltage or a zero-current switching (ZCS) of the drive current. Therefore, in order to adjust a duty ratio (duty factor) of switching means (not shown) included in the primary electrode driving circuit 31, thereby adjusting the switching timing of the primary electrode driving circuit 31, the rectified DC voltage is further supplied to a voltage-to-duty converting circuit 34, which in turn controls an on-off timing of the switching means (not shown) included in the primary electrode driving circuit 31, so that the primary electrode driving circuit 1 drives the piezoelectric transformer 1 with an adjusted half-wave sine wave.

Referring to FIG. 4, there is shown a block diagram of a prior art example of a DC-to-AC inverter using a piezoelectric transformer, which has a construction similar to that of the circuit shown in FIG. 3 and which is disclosed in "NIKKEI ELECTRONICS", No.621, pp147–157, Nov. 7, 1994.

In the inverter shown in FIG. 4, a forward type converter is constituted of an electromagnetic transformer T1 and a transistor Q1, to control a duty ratio and to realize the zero current switching (ZCS), so that a half-wave sine wave is generated to drive a piezoelectric transformer 1. An AC voltage stepped up by the piezoelectric transformer 1 is suppled to a cold-cathode fluorescent lamp constituting a load 2. A current flowing through the load 2 is converted by a resistor R10 and a diode D10 into a half-wave sinusoidal voltage, which is in turn supplied to a control IC (integrated circuit) 40.

In the control IC 40, the half-wave sinusoidal voltage is supplied through a buffer 45 to an integrating circuit 46, in which the half-wave sinusoidal voltage is converted into a DC voltage, which is in turn supplied to a VCO 42. In accordance with the magnitude of the receiving DC voltage, the VCO 42 generates a driving frequency for the piezoelectric transformer 1, and the driving frequency is supplied to a drive circuit 43 for driving the transistor Q1. As shown in FIG. 4, the control IC 40 additionally includes a starter circuit and load disconnection detection protection circuit 47, an input power source voltage detecting circuit 41, and an abnormal lighting detecting protection circuit and input voltage drop detecting protection circuit 44, which function to stop operation of the inverter shown in FIG. 4 when abnormality occurs in the power source voltage and/or in the load.

The piezoelectric transformer driving circuit shown in FIG. 1 is disadvantageous in the following points: For example, in the case that a cold-cathode fluorescent lamp is connected as the load for the piezoelectric transformer, for stabilizing luminescence of the cold-cathode fluorescent lamp, the circuit controls the driving frequency to increase or decrease the step-up ratio of the piezoelectric transformer for the purpose of controlling the current flowing through the cold-cathode fluorescent lamp to a predetermined desired value.

Generally, the piezoelectric transformer exhibits a maximum efficiency around a resonance frequency of the piezoelectric transformer, and the farther the driving frequency separates from the resonance frequency, the efficiency for transmitting an input power applied to the primary electrodes to an output power obtained from the secondary electrodes drops. Accordingly, if the piezoelectric transformer is caused to operate at a driving frequency exhibiting the maximum efficiency of the piezoelectric transformer, the driving frequency becomes the resonance frequency "fr" as shown in FIG. 5B, and then, the piezoelectric transformer operates with a maximum step-up ratio Av. Here, if the driving voltage of the piezoelectric transformer drops, the above mentioned current flowing through the cold-cathode fluorescent lamp cannot be maintained.

In the circuit shown in FIG. 1, a peak voltage VSl(Vo-p) of the driving voltage for the piezoelectric transformer is in proportion to a peak voltage Vd1(Vo-p) of the drain voltage of the transistor Q1, but as shown in FIG. 5A, since this peak drain voltage Vd1(Vo-p) of the transistor Q1 becomes about three times the input DC voltage VDD, the peak driving voltage VS1(Vo-p) is also in proportion to the input DC voltage VDD. Therefore, it is so set that, when the input DC voltage VDD is a minimum input voltage VDDmin(V), the driving frequency becomes the resonance frequency "fr" of the piezoelectric transformer in order to cause the piezoelectric transformer to operate with the maximum efficiency.

Under this condition, if the input DC voltage elevates, it is so controlled that the driving frequency for the piezoelectric transformer 1 is shifted or deviated to a frequency higher than the resonance frequency, with the result that the step-up ratio drops to supply a constant current to the load. For example, if the input DC voltage becomes two times the minimum input voltage, namely, 2 VDDmin(V), the driving frequency is controlled to a frequency "f1" which makes the step-up ratio of the piezoelectric transformer 1 a half, and if the input DC voltage becomes 3VDDmin(V), the driving frequency is controlled to a frequency "f2" which makes the step-up ratio of the piezoelectric transformer 1 one third.

However, in the control method as mentioned above, when the power source voltage supplied to the driving circuit (boosting circuit) is high, it is not possible to avoid the piezoelectric transformer from operating at a driving frequency giving a low efficiency. Therefore, in the case that the piezoelectric transformer is operated in a wide power source voltage range, an averaged efficiency inevitably drops.

In this connection, the transistors Q1 and Q2 are required to have a high breakdown voltage so that these transistors are never broken down at a peak voltage occurring when the input DC voltage VDD is maximum. Accordingly, when the power source voltage range is wide, transistors having a high breakdown voltage are required. This results in an increased on-resistance which lowers the efficiency, and also increases the cost.

Another problem has been encountered in that, since the driving frequency is elevated to lower the step-up ratio of the piezoelectric transformer when the input DC voltage VDD becomes high, the driving waveform can no longer maintain a voltage resonance (series resonance) waveform, with the result that each of the transistors Q1 and Q2 is turned on before the voltage at the primary electrodes of the piezoelectric transformer becomes zero, and therefore, a zero voltage switching (ZVS) cannot be realized. Therefore, a large current flows through each of the transistors Q1 and Q2, so that the mount of heat generation becomes large, which is often destroys the transistor. Therefore, the widening of the input voltage range is inevitably restricted by a certain upper limit.

The above mentioned restrictions make it difficult to widen the input voltage range to greatly exceed beyond about two times the minimum input voltage. Accordingly, for example, the input DC voltage range becomes from 8 V to 16 V. To the contrary, a circuit utilizing an electromagnetic transformer can have a wide input voltage range of about three or four times the minimum input voltage (for example, from 5 V to 20 V in the DC voltage), since it can have a wide driving frequency range and further is not required to adopt the driving of the voltage resonance (series resonance) type or the current resonance (parallel resonance) type. Accordingly, the inverter and the DC-to-DC converter utilizing the piezoelectric transformer are narrow in the input voltage range, in comparison with those utilizing the electromagnetic transformer, and therefore, is restricted in the extent of application.

On the other hand, in the piezoelectric transformer driving circuits shown in FIGS. 3 and 4, since the resonance frequency range of the piezoelectric transformer is narrow, namely, since the Q factor of the piezoelectric transformer is high, the driving frequency can be adjusted only in the range of a few %. In addition, the on-off duty ratio of the transistor of the one-transistor type forward type converter can almost never be changed. As a result, there similarly occurs the phenomenon that the driving voltage for the piezoelectric transformer becomes large in proportion to the input voltage, and therefore, it is necessary to drive the piezoelectric transformer in a region of a low step-up ratio by shifting the driving frequency of the piezoelectric transformer from the resonance frequency of the piezoelectric transformer, completely similarly to the example shown in FIG. 1.

In the above mentioned examples, furthermore, it is required to so design that, when the input voltage is maximum, a magnetic saturation is never caused by a current flowing through a primary winding of the electromagnetic transformer for driving the piezoelectric transformer. Accordingly, the electromagnetic transformer is required to have a sufficient margin in capacity. Since the current flowing through the primary winding is in proportion to the input voltage, if the input voltage supplied to the driving circuit becomes double, the current flowing through the primary winding correspondingly becomes double. In this case, therefore, there is required an electromagnetic transformer allowing two times the current flowing when the circuit operates at a minimum voltage.

Conventionally, in order to cause a large current to flow through a winding of the electromagnetic transformer with no magnetic saturation, the size of the electromagnetic transformer inevitably becomes large. The piezoelectric transformer can be formed in a thinned shape in comparison with the electromagnetic transformer, but if the size of the electromagnetic transformer for driving the piezoelectric transformer becomes large, the advantage of the thin shape of the piezoelectric transformer can be exerted, so that a thinned shape inverter or power supply cannot be realized.

In the above mentioned piezoelectric transformer driving circuits, in order to enable the piezoelectric transformer driving circuit to operate in a wide input voltage range, the efficiency inevitably drops, or alternatively, the size of the device unavoidably becomes large. Therefore, the input voltage range cannot be satisfactorily widened.

From a different viewpoint, in the case that the piezoelectric transformer is used as a high voltage supply for lighting a backlight composed of a cold-cathode fluorescent lamp (cold-cathode tube), it is necessary to control the current flowing through the cold-cathode fluorescent lamp in order to adjust the backlight luminance. The cold-cathode fluorescent lamp has a characteristics of a negative resistance in which if the lamp current value becomes small, the impedance increases, and can be expressed by a resistance component RL and a capacitance component CL in an electric equivalent circuit, as shown in FIG. 2.

If an absolute value of the current flowing through the cold-cathode fluorescent lamp becomes small, a current flowing in a stray capacitance can no longer be ignored, so that there occurs a difference in current value between a high voltage side and a low voltage side of the cold-cathode fluorescent lamp, with the result that the luminance becomes uneven. This is inconvenient in the case that the backlight is constituted of the cold-cathode fluorescent lamp.

Under the above mentioned circumstance, in order to widely change the luminance, a so-called "burst light adjusting method" has been known, which is also called a "pulse width modulation light adjusting method". This method is characterized in that, the lamp current of the cold-cathode fluorescent lamp is intermittently turned on and off at predetermined intervals (for example, 210 Hz) which is not sensible to a human eye as a flicker, and a ratio of an on-time to an off-time is changed to equivalently change the luminance.

In order to realize this burst light adjusting method in the piezoelectric transformer driving circuit shown in FIG. 1, it is necessary to stop the alternating on-off operation of the two transistors Q1 and Q2 in order to intermittently stop the driving voltage applied to the piezoelectric transformer. This means that one side of the load inductance is opened, with the result that the accumulated current energy is discharged as a voltage energy, which generates a voltage surge far larger than the driving voltage of the piezoelectric transformer. Accordingly, it is required to provide a protection means for protecting the transistors from breakdown. This protection means may be constituted of a protection circuit incorporating therein a Zener diode.

SUMMARY OF THE INVENTION

Accordingly, it is an object of the present invention to provide a piezoelectric transformer driving circuit which has overcome the above mentioned defects of the conventional ones.

Another object of the present invention is to provide a piezoelectric transformer capable of efficiently operating within a wide input voltage range and also capable of realizing the burst light adjustment with no protection circuit.

The above and other objects of the present invention are achieved in accordance with the present invention by a piezoelectric transformer driving circuit comprising:

a piezoelectric transformer having a pair of primary electrodes and a pair of secondary electrodes so that when an AC voltage is applied between the pair of primary electrodes, a stepped-up AC voltage is generated between the pair of secondary electrodes;

a first coil and a first transistor each connected at its one end to a first primary electrode of the pair of primary electrodes;

a second coil and a second transistor each connected at its one end to a second primary electrode of the pair of primary electrodes;

a boosting circuit having a frequency dividing circuit for alternately driving the first transistor and the second transistor;

a third transistor having one end connected to receive an input DC voltage and the other and connected to the other end of each of the first coil and the second coil;

a current maintaining means connected to the other end of each of the first coil and the second coil;

a drive voltage control means for turning off the third transistor in accordance with a variable duty ratio signal during an on-period of each of the first and second transistors, thereby to control a drive voltage applied to the primary electrodes of the piezoelectric transformer at a predetermined voltage; and a frequency control means for changing a driving frequency supplied to the first and second transistors, to control a step-up ratio of the piezoelectric transformer so that an output voltage of a predetermined magnitude can be obtained from the pair of secondary electrodes of the piezoelectric transformer.

In one embodiment, the current maintaining means is formed of a diode having an anode-grounded diode having a cathode connected to the other end of each of the first coil and the second coil.

In another embodiment, the current maintaining means is formed of a fourth transistor connected between the ground and the other end of each of the first coil and the second coil, the fourth transistor and the third transistor being turned on exclusively to each other.

In a specific embodiment, the piezoelectric transformer driving circuit further includes means for selectively turning off the third transistor in a time-division manner so as to stop the input voltage applied to the piezoelectric transformer, thereby to change an effective value of the AC current or voltage supplied to a load connected to the secondary electrodes of the piezoelectric transformer.

Preferably, the frequency control means includes detecting means for detecting the AC voltage or current supplied from the piezoelectric transformer to a load connected to the secondary electrodes of the piezoelectric transformer, and a triangular wave generating means for generating, on the basis of an output of the detecting means, a triangular wave having a variable frequency in accordance with the output of the detecting means, and the drive voltage control means including a rectifying means connected to the one end of one of the first and second coils, and a comparing means for comparing a rectified voltage outputted from the rectifying means and the triangular wave outputted from the triangular wave generating means, to generate the variable duty ratio signal when the rectified voltage is higher than a voltage of the triangular wave.

According to another aspect of the present invention, there is provided a piezoelectric transformer driving circuit comprising:

a piezoelectric transformer having a pair of primary electrodes and a pair of secondary electrodes so that when an AC voltage is applied between the pair of primary electrodes, a stepped-up AC voltage is generated between the pair of secondary electrodes;

a first autotransformer having a secondary terminal connected to a first primary electrode of the pair of primary electrodes and an intermediate tap connected to one end of a first transistor;

a second autotransformer having a secondary terminal connected to a second primary electrode of the pair of primary electrodes and an intermediate tap connected to one end of a second transistor;

a boosting circuit having a frequency dividing circuit for alternately driving the first transistor and the second transistor;

a third transistor having one end connected to receive an input DC voltage and the other and connected to a primary terminal of each of the first autotransformer and the second autotransformer;

a current maintaining means connected to the primary terminal of each of the first autotransformer and the second autotransformer;

a drive voltage control means for turning off the third transistor in accordance with a variable duty ratio signal during an on-period of each of the first and second transistors, thereby to control a drive voltage applied to the primary electrodes of the piezoelectric transformer at a predetermined voltage; and a frequency control means for changing a driving frequency supplied to the first and second transistors, to control a step-up ratio of the piezoelectric transformer so that an output voltage of a predetermined magnitude can be obtained from the pair of secondary electrodes of the piezoelectric transformer.

In one embodiment, the current maintaining means is formed of a diode having an anode-grounded diode having a cathode connected to the primary terminal of each of the first autotransformer and the second autotransformer.

In another embodiment, the current maintaining means is formed of a fourth transistor connected between the ground and the primary terminal of each of the first autotransformer and the second autotransformer, the fourth transistor and the third transistor being turned on exclusively to each other.

In a specific embodiment, the piezoelectric transformer driving circuit further includes means for selectively turning off the third transistor in a time-division manner so as to stop the input voltage applied to the piezoelectric transformer, thereby to change an effective value of the AC current or voltage supplied to a load connected to the secondary electrodes of the piezoelectric transformer.

Preferably, the frequency control means includes detecting means for detecting the AC voltage or current supplied from the piezoelectric transformer to a load connected to the secondary electrodes of the piezoelectric transformer, and a triangular wave generating means for generating, on the basis of an output of the detecting means, a triangular wave having a variable frequency in accordance with the output of the detecting means, and the drive voltage control means including a rectifying means connected to the intermediate tap of one of the first and second autotransformers, and a comparing means for comparing a rectified voltage outputted from the rectifying means and the triangular wave outputted from the triangular wave generating means, to generate the variable duty ratio signal when the rectified voltage is higher than a voltage of the triangular wave.

According to still another aspect of the present invention, there is provided a piezoelectric transformer driving circuit comprising:

a piezoelectric transformer having a primary electrode side and a secondary electrode side so that when an AC voltage is applied to the primary electrode side, a stepped-up AC voltage is generated at the secondary electrode side;

a boosting means having a coil connected to receive at its one end a DC voltage and a first transistor connected to the other end of the coil, the boosting means selectively turning on the first transistor within each one driving period for the piezoelectric transformer so that a current energy is supplied to the coil from the input DC voltage, and then, selectively turning off the first transistor so that an electric energy accumulated in the coil is supplied as a voltage energy to the secondary electrode side of the piezoelectric transformer;

drive voltage control means including a second transistor and a current maintaining means for maintaining a current flowing through the coil, each of the second transistor and the current maintaining means being connected to the one end of the coil, the drive voltage control means turning on and off the second transistor within the each one driving period for the piezoelectric transformer and within a period in which the first transistor is on, thereby to change a duty ratio of an operation of the current maintaining means, for controlling a drive voltage applied to the piezoelectric transformer at a predetermined level; and a frequency control means for changing a driving frequency supplied to the boosting means, to control a step-up ratio of the piezoelectric transformer so that an output voltage of a predetermined magnitude can be obtained from the secondary electrode side of the piezoelectric transformer.

Alternatively, the boosting means can include a secondary coil magnetically coupled to the first named coil, and the secondary coil being connected to the primary electrode side of the piezoelectric transformer so that an elevated voltage is applied from the secondary coil to the primary electrode side of the piezoelectric transformer.

In one embodiment, the current maintaining means is formed of a diode having an anode-grounded diode having a cathode connected to the one end of the first named coil.

In another embodiment, the current maintaining means is formed of a third transistor connected between the ground and the one end of the first named coil, the second transistor and the third transistor being turned on exclusively to each other.

In special embodiment, the piezoelectric transformer driving circuit further includes means for selectively turning off the second transistor in a time-division manner so as to stop the voltage applied to the piezoelectric transformer, thereby to change an effective value of the AC voltage supplied to a load connected to the secondary electrodes of the piezoelectric transformer.

Preferably, the frequency control means includes detecting means for detecting the AC voltage or current supplied from the piezoelectric transformer to a load connected to the secondary electrodes of the piezoelectric transformer, and a triangular wave generating means for generating, on the basis of an output of the detecting means, a triangular wave having a variable frequency in accordance with the output of the detecting means, and the drive voltage control means including a rectifying means connected to the one end of the first named coil, and a comparing means for comparing a rectified voltage outputted from the rectifying means and the triangular wave outputted from the triangular wave generating means, to generate the variable duty ratio signal when the rectified voltage is higher than a voltage of the triangular wave.

With the above mentioned arrangement, even if the input DC voltage varies, the drive voltage control means operates to control a maximum value of the current flowing through the coil or the primary winding of the electromagnetic transformer, so that the sine wave voltage applied to the piezoelectric transformer is maintained at a predetermined constant value, whereby the driving frequency of the piezoelectric transformer does not separate from the resonance frequency within a wide input voltage range. Therefore, the piezoelectric transformer can be driven with the driving frequency realizing a high efficiency.

Furthermore, even if the input DC voltage becomes the maximum voltage, the peak value of the current flowing through the coil or through the primary winding of the electromagnetic transformer is controlled at the same current value as that when the input DC voltage is the minimum voltage. Accordingly, since it is not necessary to use a coil or an electromagnetic transformer having a sufficient margin in capacity, a small-size coil or electromagnetic transformer can be used, so that them can be realized a driving circuit suitable to a thinness and a small size of the piezoelectric transformer.

Since the driving frequency does not change with variation of the input DC voltage, the driving waveform of the piezoelectric transformer does not change. Therefore, the piezoelectric transformer can be driven with the driving frequency realizing a high efficiency, while satisfying the condition for the zero voltage switching (ZVS). Accordingly, even if the input DC voltage becomes large, the heat generation of the transistors can be avoided, thereby to prevent the drop of the efficiency and the breakdown of the transistors.

In the case of putting the piezoelectric transformer driving circuit in a stop condition, the electric power for the driving circuit can be easily shut down by turning off the transistor provided at the input voltage side. Therefore, it is possible to easily stop a DC-to-AC inverter or a DC-to-DC converter, so as to put the inverter or converter into a low power consumption condition.

In the case of using the piezoelectric transformer driving circuit in accordance with the present invention as the inverter for a backlight and to perform the burst light adjustment which intermittently shuts off the lamp current for the purpose of adjusting the brightness of the lamp, if the transistor provided at the input voltage side is controlled in the PWM fashion, since it is possible to stop the driving waveform of the piezoelectric transformer without generating a high voltage at the resonance coil or electromagnetic transformer, a high voltage protection element such as a Zener diode becomes unnecessary.

The above and other objects, features and advantages of the present invention will be apparent from the following description of preferred embodiments of the invention with reference to the accompanying drawings.

DESCRIPTION OF THE PREFERRED EMBODIMENTS

Now, embodiments of the piezoelectric transformer driving circuit in accordance with the present invention will be described with reference to the accompanying drawings.

Figure 1:
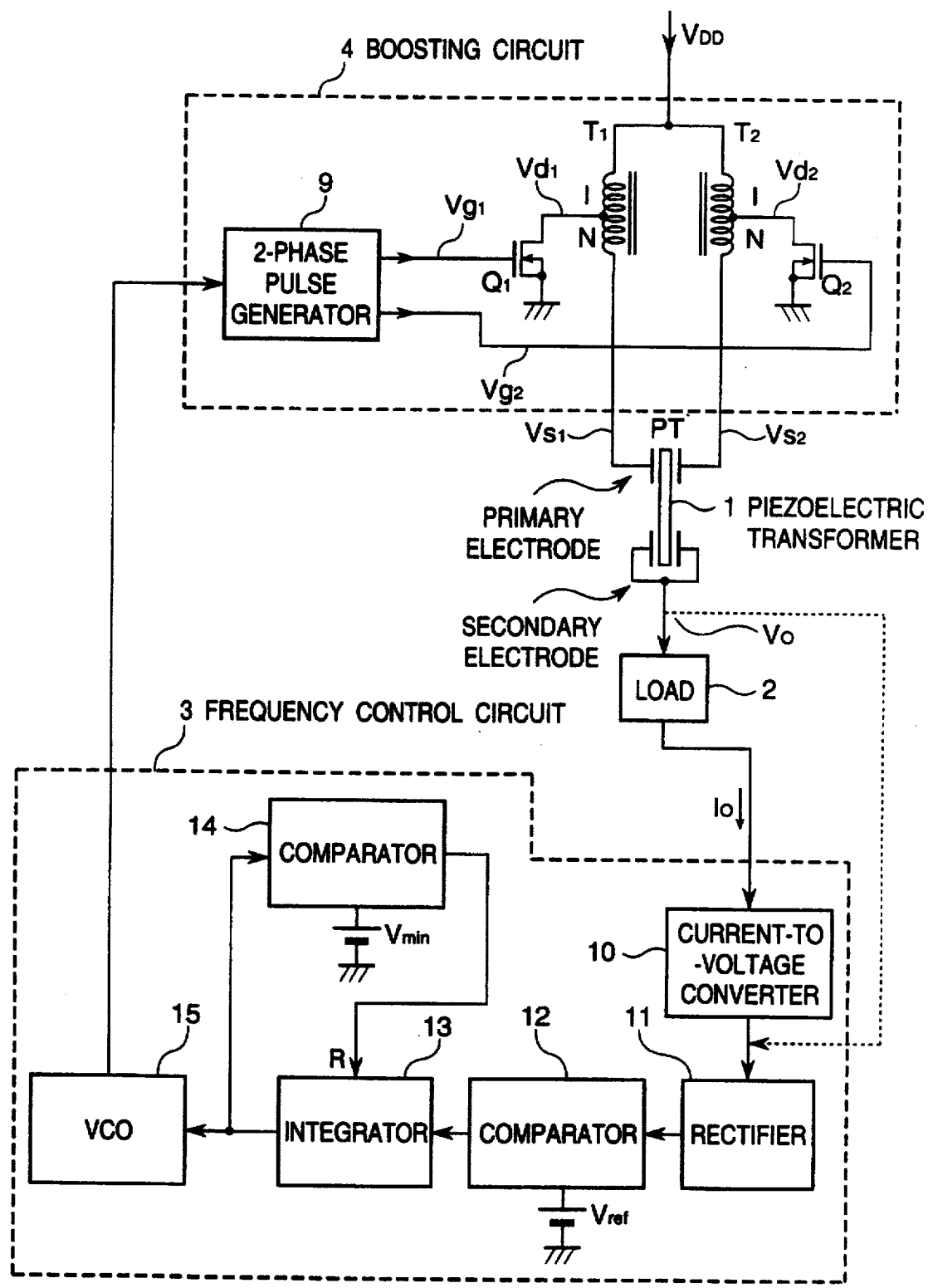
FIG. 1 is a block diagram of one piezoelectric transformer driving circuit proposed by the inventor of the present application.
Figure 2:
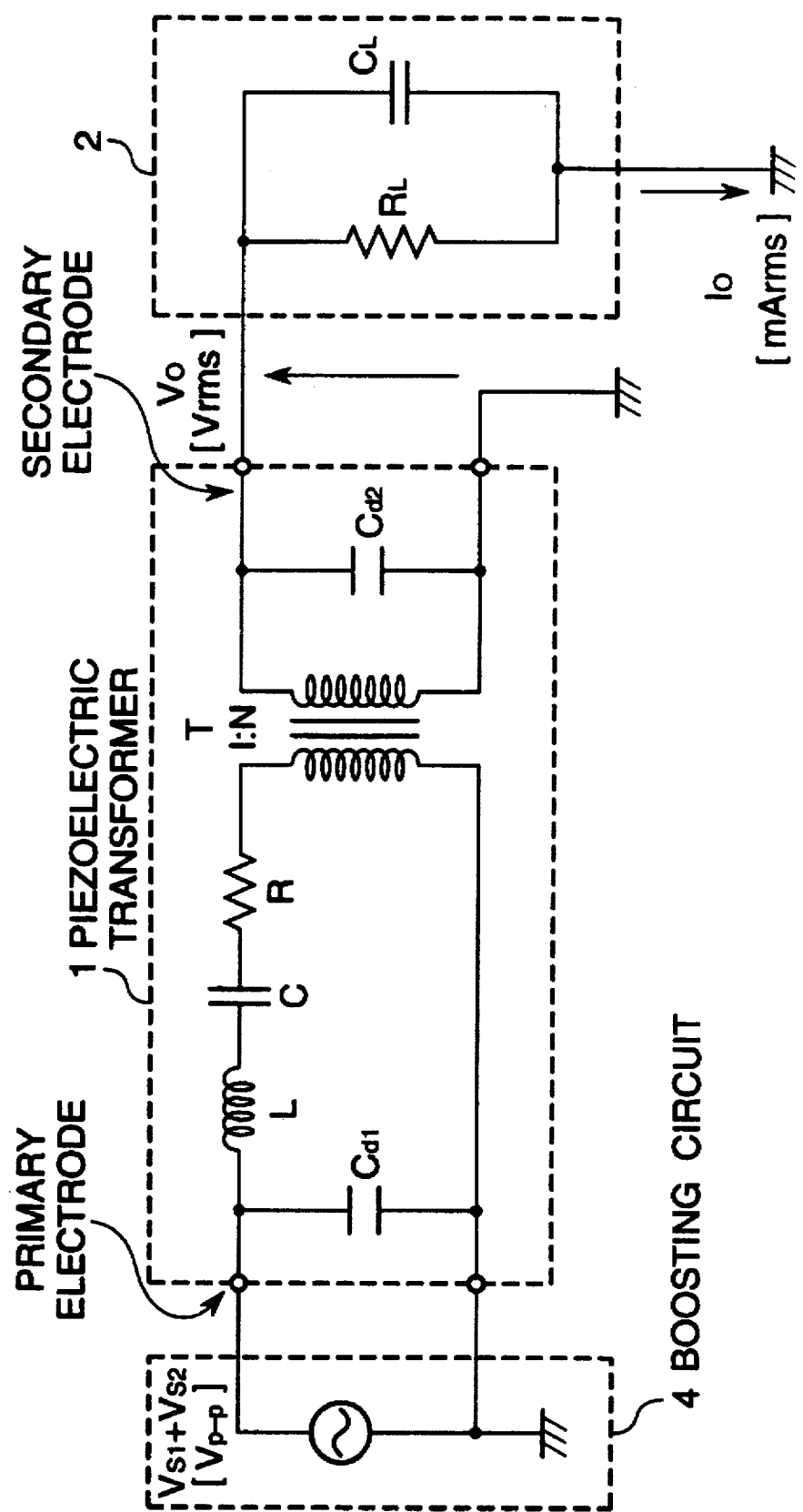
FIG. 2 is an equivalent circuit of a part composed of the piezoelectric transformer, the boosting circuit and the load, in the circuit shown in FIG. 1.
Figure 3:
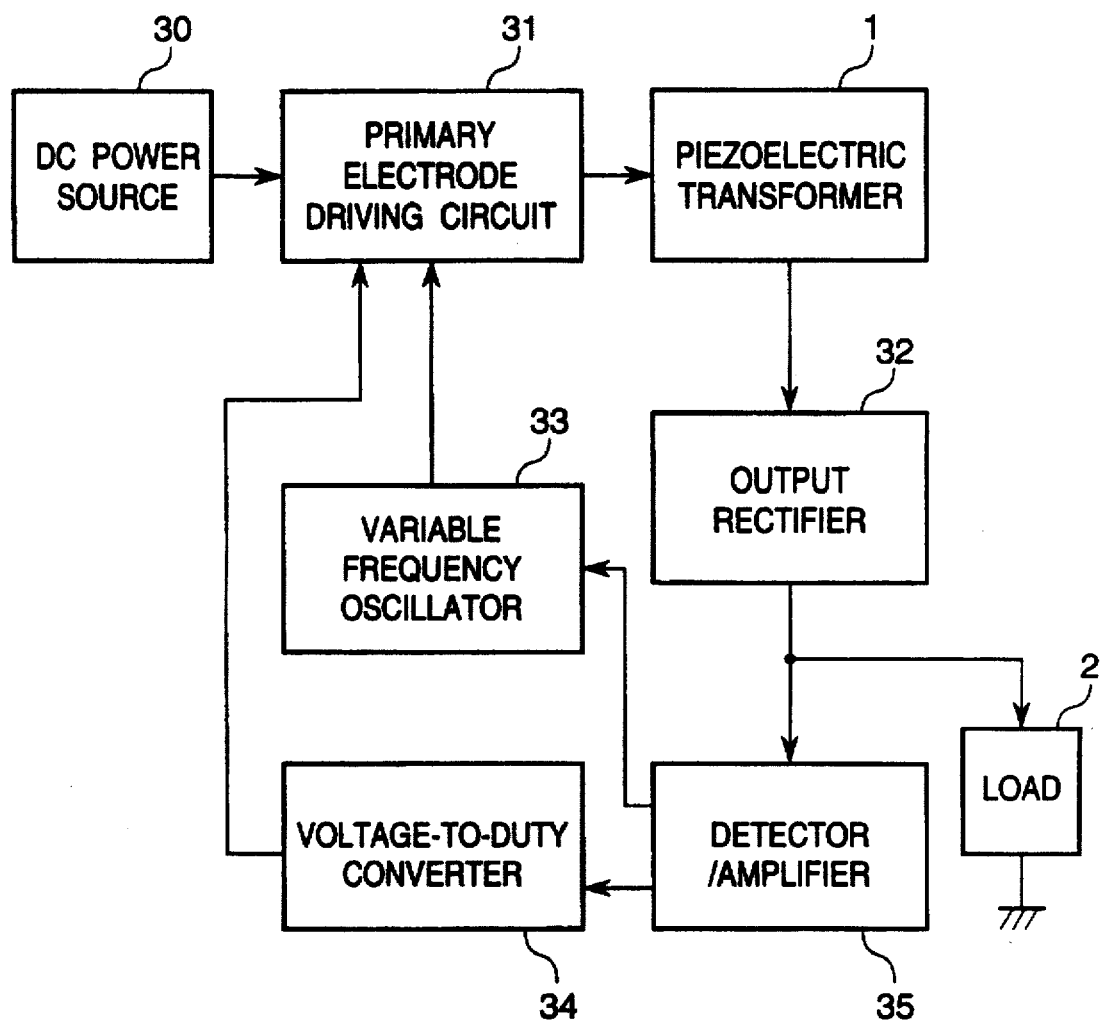
FIG. 3 is a block diagram of a prior art example of the DC-to-DC converter using a piezoelectric transformer.
Figure 4:
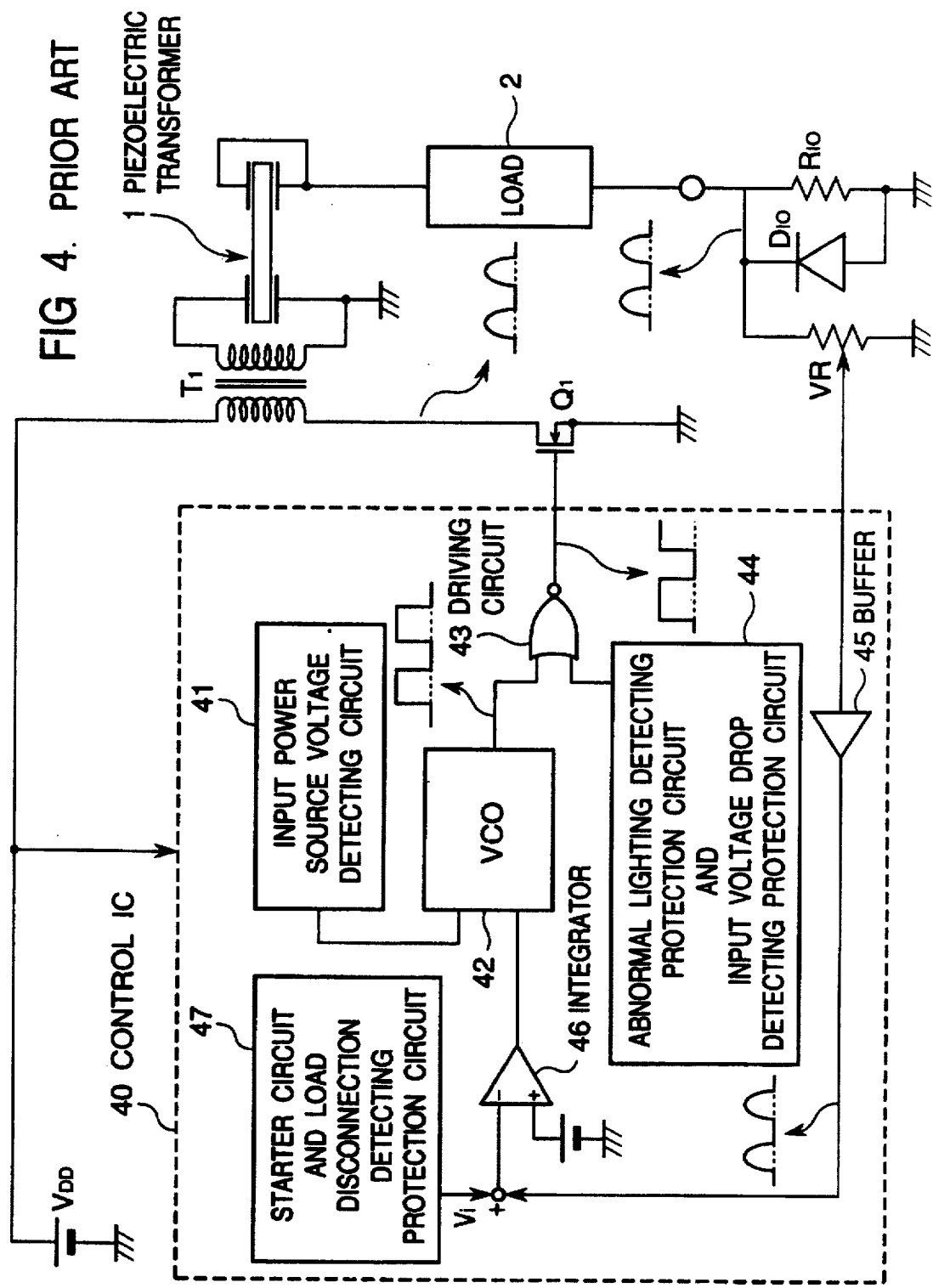
FIG. 4 is a block diagram of a prior art example of a DC-to-AC inverter using a piezoelectric transformer.
Figure 5A:
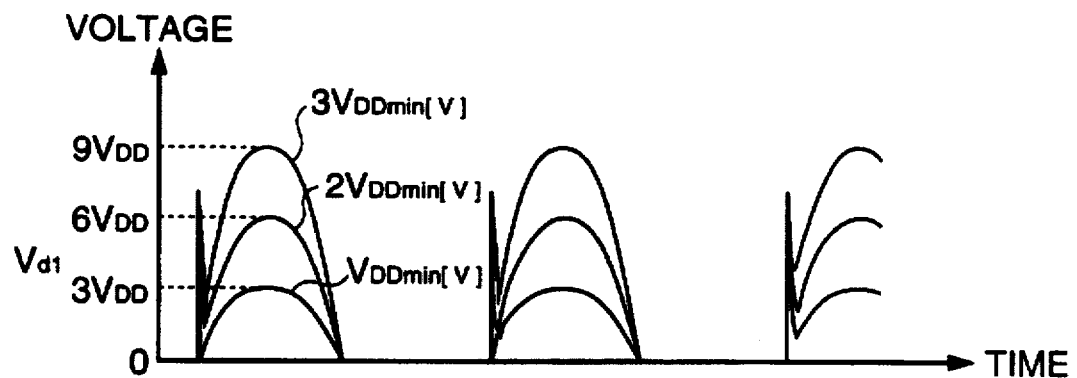
FIG. 5A is a waveform diagram illustrating a relation between the input DC voltage VDD and the peak drain voltage Vd1(Vo-p) of the boosting circuit of the piezoelectric transformer driving circuit.
Figure 5B:
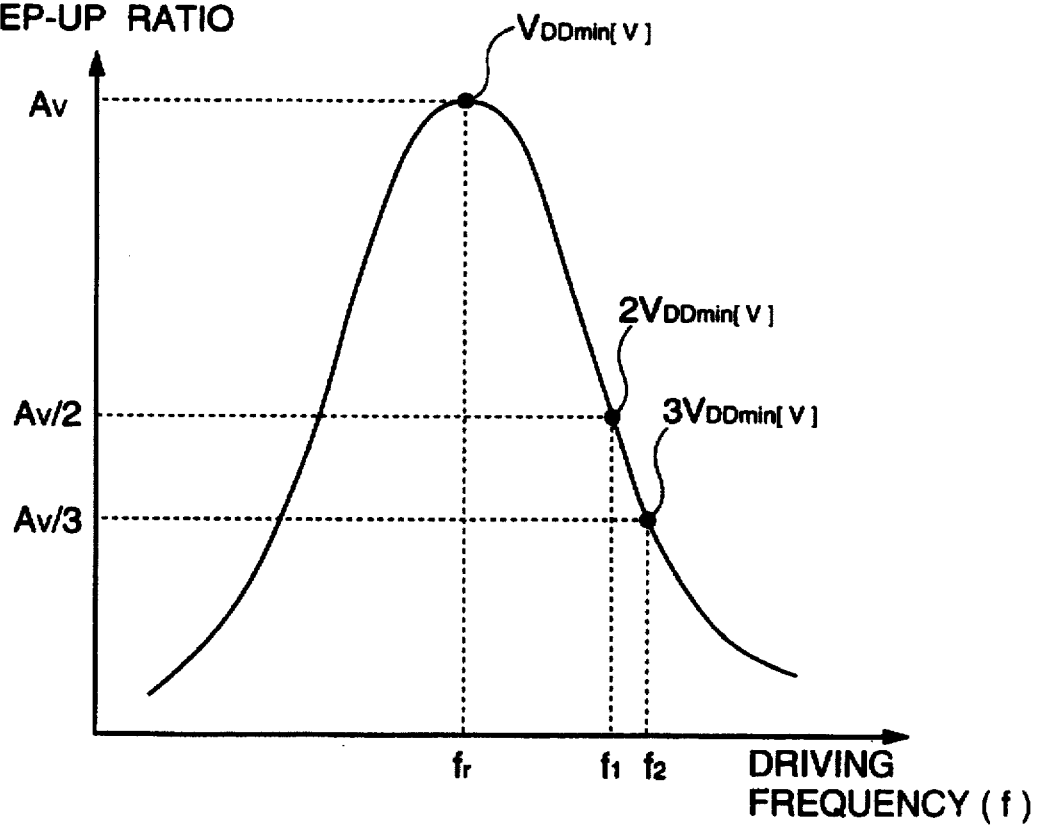
FIG. 5B is a graph illustrating a relation between a driving frequency and a step-up ratio of the piezoelectric transformer.
Figure 6:
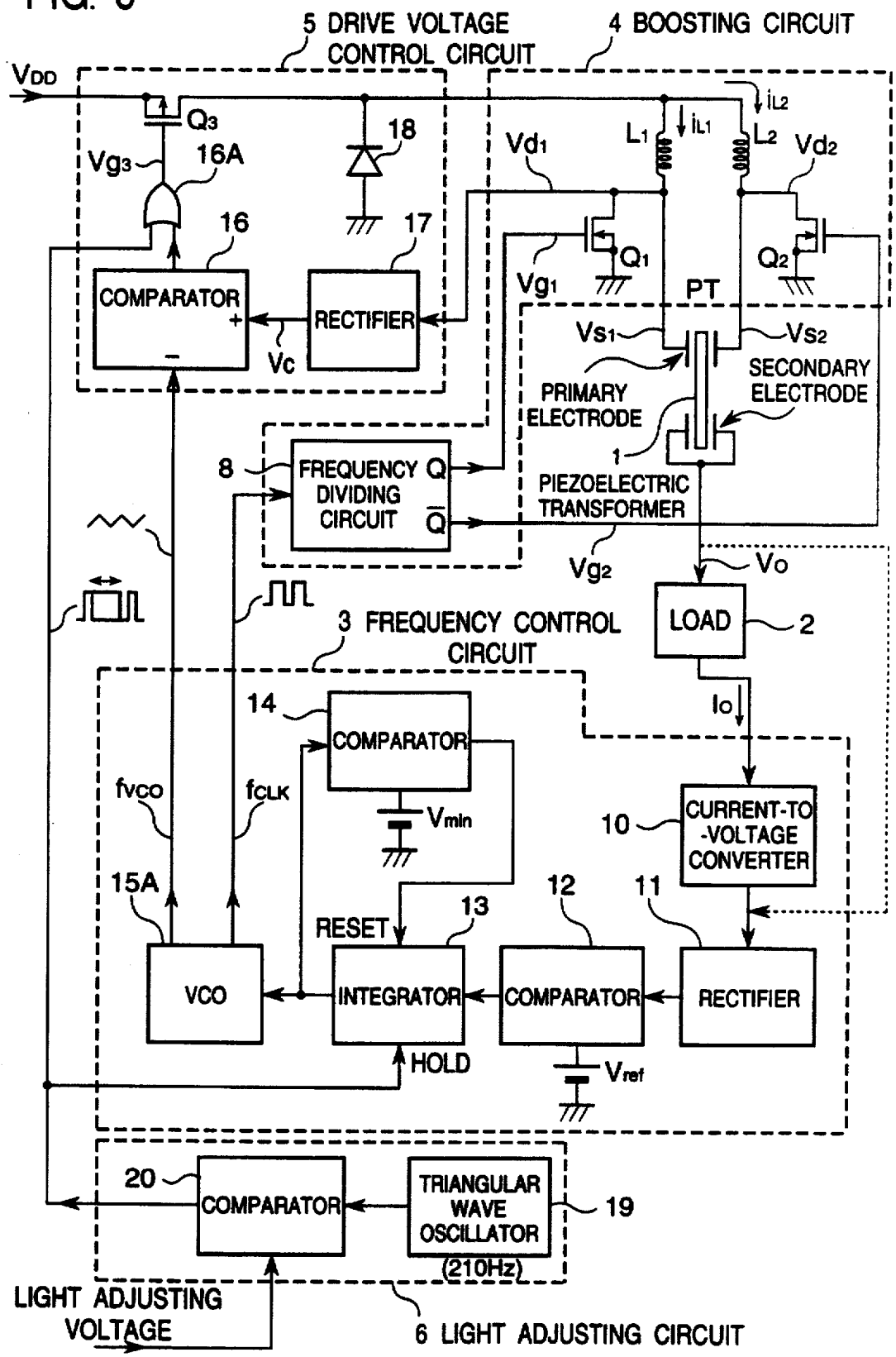
FIG. 6 is a block diagram of a first embodiment of the piezoelectric transformer driving circuit in accordance with the present invention.

Referring to FIG. 6, there is shown a block diagram of a first embodiment of the piezoelectric transformer driving circuit in accordance with the present invention, which constitutes an inverter, and which is mainly composed of four function blocks. In FIG. 6, elements similar to those shown in FIG. 1 are given the same Reference Numerals, and explanation thereof will be omitted for simplification of description.

The shown embodiment comprises:

(1) a frequency control circuit 3 configured to detect an AC current IO(mArms) flowing through a load 2 connected to secondary electrodes of a piezoelectric transformer 1 or alternatively to detect an AC voltage VO(Vrms) applied to the load 2, as shown by a dotted line in FIG. 6, and to control a driving frequency of the piezoelectric transformer in order to maintain the AC current IO(mArms) or the AC voltage VO(Vrms) at a constant level;

(2) a boosting circuit 4 receiving an input DC voltage VDD and controlled by the frequency control circuit 3, for generating, from the received input DC voltage VDD, an AC voltage of the driving frequency controlled by the frequency control circuit 3, to apply the generated AC voltage between primary electrodes of the piezoelectric transformer 1;

(3) a driving voltage control circuit 5 connected to the boosting circuit 4 and controlled by the frequency control circuit 3, for controlling a driving voltage of a sine wave applied to the piezoelectric transformer 1, at a predetermined value, independently of variation of the input DC voltage VDD; and (4) a light adjusting circuit 6 for controlling the value of the current flowing through the load 2, in a PWM fashion.

Accordingly, it may be roughly said that the first embodiment includes the driving voltage control circuit 5 and the light adjusting circuit 6 in addition to the construction shown in FIG. 1.

As shown in FIG. 6, the driving voltage control circuit 5 includes a rectifying circuit 17 receiving an voltage Vd1 from an output end of a coil L1 included in the boosting circuit 4, a comparator 16 having a first input connected to receive an output signal VC of the rectifying circuit 17 and a second input connected to receive a triangular wave signal fVCO from a VCO (voltage controlled oscillator) 15A in the frequency control circuit 3, an OR gate 16A receiving an output of the comparator and an output of the light adjusting circuit 6, a P-channel MOS transistor Q3 having a gate connected to an output Vg3 of the OR gate 16A, a source connected to the input DC voltage VDD, and a drain connected, as an output of the driving voltage control circuit 5, to a voltage input of the boosting circuit 4, namely, to an input end of each of coils L1 and L2 included in the boosting circuit 4, and an anode-grounded diode 18 having a cathode connected to the drain of the transistor Q3.

With this arrangement, the driving voltage control circuit 5 operates to maintain the peak value of the current supplied to the coils L1 and L2 included in the boosting circuit 4, at a constant level, regardless of variation of the input DC voltage VDD, for the purpose of controlling the drive voltage for the piezoelectric transformer 1 at the predetermined value.

In the example shown in FIG. 1, the frequency of the output signal of the VCO 15 is the same as the driving frequency of the piezoelectric transformer, but in the shown embodiment, the VCO 15A is configured to generate a triangular wave fVCO having the frequency 2f which is two times the driving frequency f of the piezoelectric transformer 1, and also a rectangular wave fCLK having the same doubled frequency 2f. This rectangular wave fCLK is frequency-divided, by a frequency dividing circuit 8 included in the boosting circuit 4, into a pair of complementary rectangular waves Vg1 and Vg2 having a frequency which is a half of the frequency 2f. The pair of complementary rectangular waves Vg1 and Vg2 are applied to a gate of transistors Q1 and Q2, respectively, to alternatively and alternately turn on and off these transistors Q1 and Q2.

Figure 7:
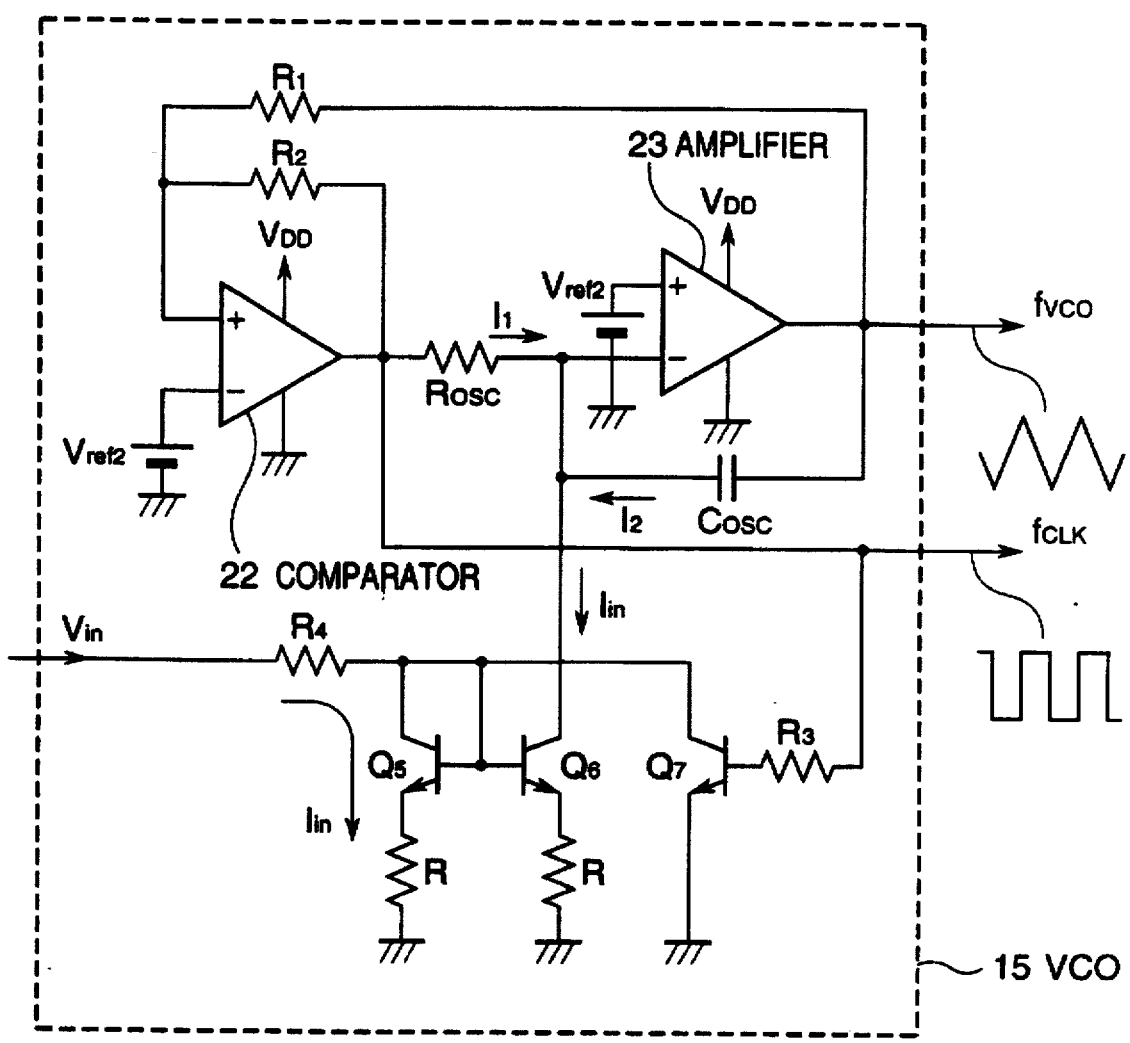
FIG. 7 is a circuit diagram of the voltage controlled oscillator incorporated in the piezoelectric transformer driving circuit shown in FIG. 6.

Referring to FIG. 7, there is shown a circuit diagram of the VCO 15A incorporated in the circuit shown in FIG. 6.

The VCO 15A includes a pair of NPN bipolar transistors Q5 and Q6 having their emitter grounded through a resistor R and their base connected in common to each other, a collector of the transistor Q5 being connected through a resistor R4 to receive an input voltage supplied from the integrating circuit 13, and also connected to the base of the transistor Q5 itself. With this arrangement, a current mirror is constituted of the transistors Q5 and Q6, so that a current Iin flows through the transistor Q5 in response to the control voltage Vin, and therefore, the same current Iin can flow through the transistor Q6.

The VCO 15A also includes a comparator 22 having an inverting first input connected to a reference voltage Vref2 and a non-inverting second input connected to an output of the comparator 22 itself through a feedback resistor R2. The output of the comparator 22 is connected through a resistor R3 to a base of an emitter-grounded NPN bipolar transistor Q7 having a collector connected to the collector of the transistor Q5. With this arrangement, the output of the comparator 22 outputs the rectangular wave fCLK.

The output of the comparator 22 is also connected through a resistor ROSC to an inverting input of an operational amplifier 23 having a non-inverting input connected to a reference voltage Vref2. An output of the amplifier 23 is connected through a feedback capacitor COSC to the inverting input of an operational amplifier 23 and through a feedback resistor R1 to the non-inverting input of the comparator 22. With this arrangement, the output of the amplifier 23 outputs the triangular wave fVCO.

Now, operation of the VCO 15A will be described. When the control voltage Vin is a minimum voltage Vmin and the output of the comparator 22 is a high level equal to the DC power source voltage VDD, a current I1 flowing into the inverting input of the amplifier 23 through the resistor ROSC so that a potential of the inverting input of the amplifier 23 elevates. The non-inverting input of the amplifier 23 supplied with the reference voltage Vref2 which is about a haft of the input DC voltage VDD. At this time, therefore, since a potential of the non-inverting input of the amplifier 23 is higher than the potential of the inverting input of the amplifier 23, the output voltage of the amplifier 23 continues to lower so that a current equal to the current I1 continues to flow into the amplifier 23. At the current where the potential difference between the non-inverting input and the inverting input of the amplifier 23 becomes zero, the amplifier 23 becomes stable, so that I1=−I2. In this condition, if the output of the comparator 22 is at the high level, the transistor Q7 is on, and therefore, the transistor Q6 is off, so that the current Iin does not flow through the transistor Q6.

Therefore, the output voltage of the amplifier 23 continues to lower at a constant rate per unitary time, so as to cause a constant current of I1=−I2 to flow through the capacitor COSC. Furthermore, when the output of the comparator 22 is at the high level, the end of the resistor R2 connected to the output of the comparator 22 is at the power source voltage VDD as a matter of course. The other end of the resistor R2 is connected to the non-inverting input of the comparator 22 and also through the resistor R1 to the output of the amplifier 23. Therefore, a potential difference between the output of the amplifier 23 and the power source voltage VDD is divided by the resistors R1 and R2, and the divided voltage is applied to the non-inverting input of the comparator 22, so that the potential of the non-inverting input of the comparator 22 continues to drop with the lowering of the output voltage of the amplifier 23.

Here, the values of the resistors R1 and R2 are so selected that when the output voltage of the amplifier 23 becomes a low level voltage VL(V), the voltage of the non-inverting input of the comparator 22 becomes equal to the reference voltage Vref2 applied to the inverting input of the comparator 22. Therefore, when the output voltage of the amplifier 23 becomes a low level voltage VL(V), the output voltage of the comparator 22 is flipped to the low level. As a result, the direction of the current I1 is inverted. Since the output of the amplifier 23 causes the constant current of −I1=I2 to flow through the capacitor COSC, the output voltage of the amplifier 23 continues to elevate at a constant rate per unitary time, conversely to the case that the output of the comparator 22 is at the high level.

When the output of the comparator 22 is at the low level, the one end of the resistor R2 is at a ground voltage level. As mentioned above, the other end of the resistor R2 is connected to the non-inverting input of the comparator 22 and also through the resistor R1 to the output of the amplifier 23. Therefore, the potential difference between the output of the amplifier 23 and the ground voltage level is divided by the resistors R1 and R2, and the divided voltage is applied to the non-inverting input of the comparator 22. As a result, the potential of the non-inverting input of the comparator 22 continues to elevate with the elevation of the output voltage of the amplifier 23.

When the output of the comparator 22 is at the low level, the transistor Q7 is off, so that the transistors Q5 and Q6 function as the current mirror, and therefore, a current equal to the current Iin flowing from the control voltage terminal for the control voltage Vin flows from the inverting input of the amplifier 23 through the transistor Q6 to the ground. Here, it is so designed that when Vin is equal to Vmin, Iin becomes zero. Therefore, the current of −I1=I2 flows through the capacitor COSC with Vin=Vmin.

Thus, when the output of the comparator 22 is at the low level, since the output voltage of the amplifier 23 continues to elevate at a constant rate per unitary time, the voltage of the non-inverting input of the comparator 22 (which is obtained by dividing the potential difference between the output voltage of the amplifier 23 and the ground level voltage by the dividing resistors R1 and R2) correspondingly continues to elevate. Here, since the values of the resistors R1 and R2 are so selected that when the output voltage of the amplifier 23 becomes the high level voltage VH(V), the voltage of the non-inverting input of the comparator 22 becomes equal to the reference voltage Vref2 applied to the inverting input of the comparator 22, the output voltage of the comparator 22 returns to the high level.

In the manner mentioned above, the triangular wave fVCO is outputted from the amplifier 23, and the rectangular wave fCLK is outputted from the comparator 22.

Figure 8A:
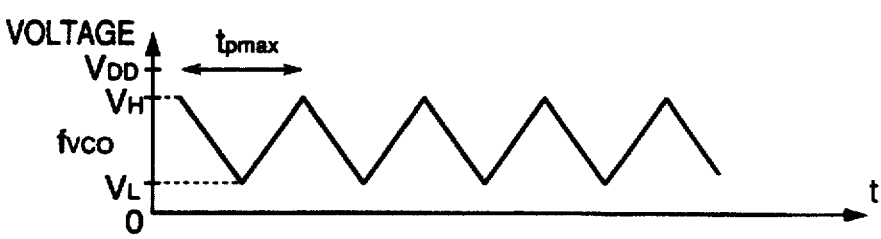
FIGS. 8A to 8F are timing charts illustrating an operation of the voltage controlled oscillator incorporated in the piezoelectric transformer driving circuit shown in FIG. 6.
Figure 8B:
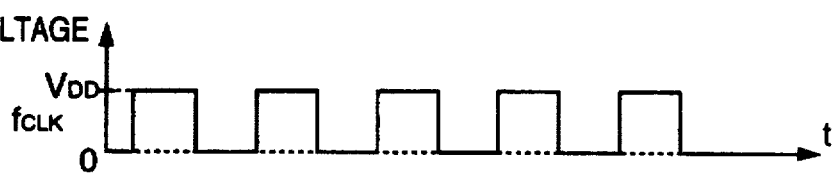
Figure 8C:
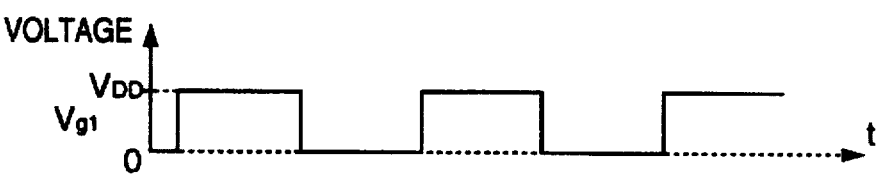

Here, FIGS. 8A, 8B and 8C illustrate waveforms outputted from the VCO 15A in the case of the control voltage Vin=Vmin. FIG. 8A illustrates the voltage waveform of the triangular wave fVCO, and FIG. 8B illustrates the voltage waveform of the rectangular wave fCLK. FIG. 8C illustrates the voltage waveform of Vg1 which is obtained by frequency-dividing the rectangular wave fCLK by the frequency dividing circuit 8 of the boosting circuit 4. As seen from FIG. 8C, the frequency dividing circuit 8 is configured to flip its output in synchronism with a rising edge of the rectangular wave fCLK.

On the other hand, when the output of the comparator 22 is at the low level, the current mirror circuit composed of transistors Q5 and Q6 causes the current Iin in proportion to the control voltage Vin, to flow from the inverting input of the amplifier 23 to the ground, with the result that the output of the amplifier 23 causes the current of I2=−I1+Iin to flow. Therefore, since I2 increases with the control voltage Vin, the current charging the capacitor COSC correspondingly increases, with the result that an increasing rate per unitary time of the output voltage of the amplifier 23 becomes large, so that a rising time of the triangular waver fVCO becomes short. Accordingly, the larger the control voltage Vin becomes, the shorter the period of the triangular waver fVCO becomes, and at the same time, the shorter the period of the rectangular waver fCLK becomes. Thus, the VCO 15A can output the triangular waver fVCO and the rectangular waver fCLK having the frequency in proportion to the input control voltage Vin.

Figure 8D:
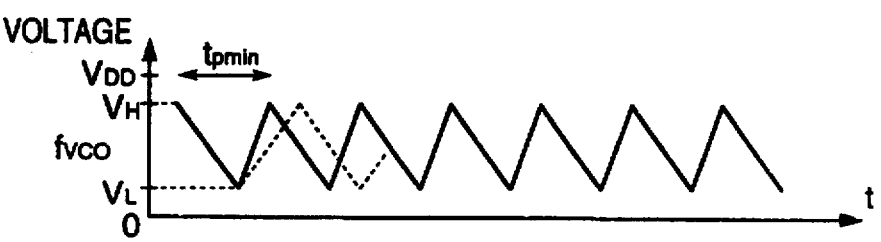
Figure 8E:
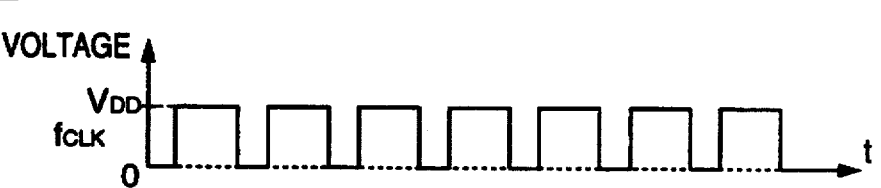
Figure 8F:
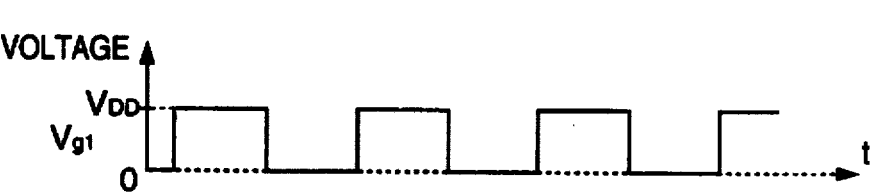

FIGS. 8D, 8E and 8F illustrate waveforms outputted from the VCO 15A in the case that the control voltage Vin becomes a maximum voltage Vmax, with the result that the frequency of the triangular wave fVCO becomes high. FIG. 8D illustrates the voltage waveform of the triangular wave fVCO, and FIG. 8E illustrates the voltage waveform of the rectangular wave fCLK. FIG. 8F illustrates the voltage waveform of Vg1 which is obtained by frequency-dividing the rectangular wave fCLK by the frequency dividing circuit 8 of the boosting circuit 4.

In FIG. 8D, the dotted line illustrates the voltage waveform of the triangular wave fVCO when the control voltage Vin is the minimum voltage Vmin. As seen from FIG. 8D, the rising edge of triangular wave fVCO becomes sharp when the control voltage Vin becomes high.

Returning to FIG. 6, the doubled-frequency triangular wave fVCO generated in the VCO 15 is supplied to the second input of the comparator 16 of the drive voltage control circuit 5. The rectifying circuit 17 receives and rectifies a voltage at a primary electrode of the piezoelectric transformer 1, to supply a rectified voltage Vc to the first input of the comparator 16.

Figure 9A:
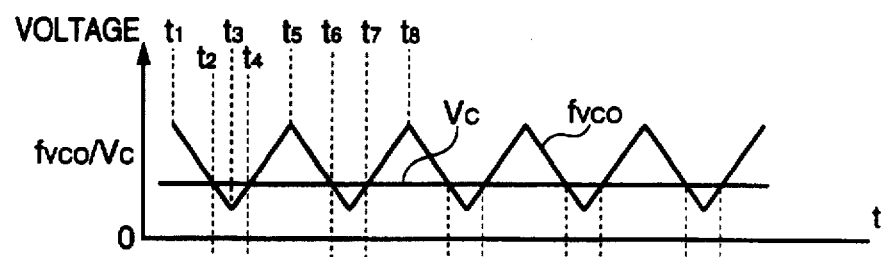
FIG. 9A to 9H are timing charts illustrating an operation of the piezoelectric transformer driving circuit shown in FIG. 6.
Figure 9B:
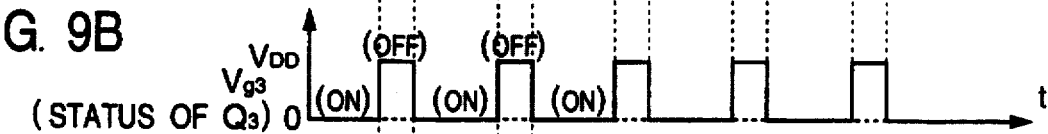
Figure 9C:
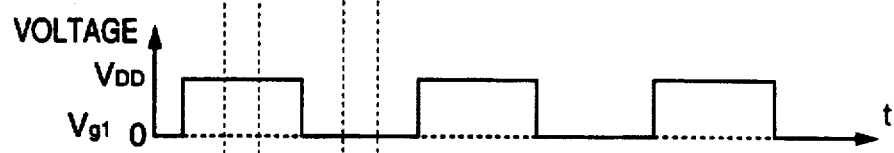
Figure 9D:
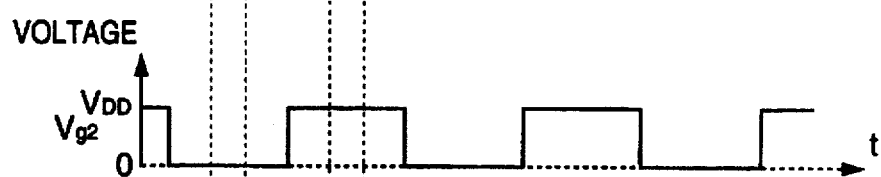
Figure 9E:
Figure 9F:
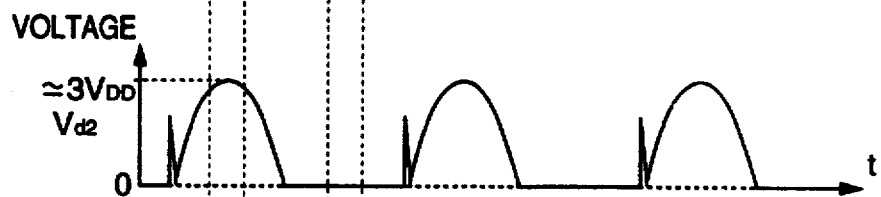
Figure 9G:
Figure 9H:
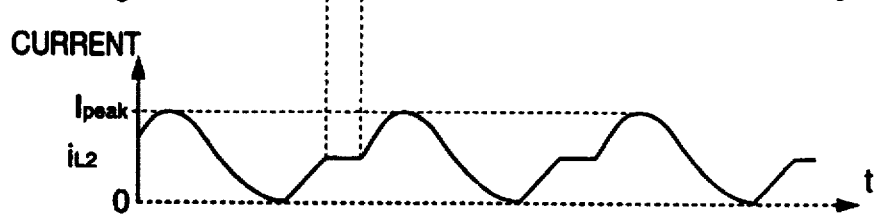

Referring to FIGS. 9A to 9H, there shown timing charts illustrating an operation of the piezoelectric transformer driving circuit shown in FIG. 6. FIG. 9A illustrate the waveforms of the triangular wave fVCO and the rectified voltage Vc supplied to the comparator 16, and FIG. 9B illustrates a voltage output Vg3 of the comparator 16, which is applied to the gate of the transistor Q3. FIGS. 9C and 9D illustrate the waveform of the gate voltages Vg1 and Vg2 of the transistors Q1 and Q2, and FIGS. 9E and 9F illustrate the waveform of the drain voltages Vd1 and Vd2 of the transistors Q1 and Q2. FIGS. 9G and 9H illustrate the waveform of coil currents IL1 and IL2 flowing through the coils L1 and L2, respectively.

Since the transistor Q3 is of the P-channel, when the voltage output Vg3 of the comparator 16 is at a low level, the transistor Q3 is turned on, and when the voltage output Vg3 is at a high level, the transistor Q3 is turned off.

Here, it is so designed that when the input DC voltage VDD is at a minimum voltage, the rectified voltage Vc becomes equal to a minimum or bottom voltage of the triangular wave fVCO. In this condition, if the input DC voltage VDD is elevated, the rectified voltage Vc elevates and enters in an amplitude region of the triangular wave fVCO, as shown in FIG. 9A.

Figure 10A:
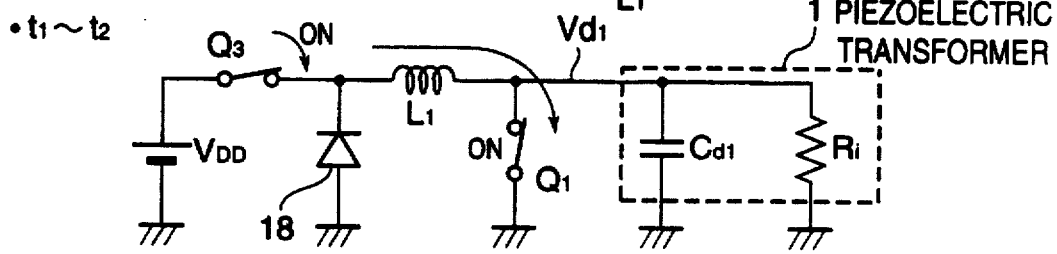
FIGS. 10A to 10E are equivalent circuits illustrating the operation of the piezoelectric transformer driving circuit shown in FIG. 6.

During a period from time t1 to t2 in which the voltage of the triangular wave fVCO is larger than the rectified voltage Vc, the output signal Vg3 of the comparator 16 becomes the low level. In this period, since the gate voltage Vg1 is at the high level as shown in FIG. 9C, the transistor Q1 is turned on, so that a current starts to flow through the coil L1. FIG. 10A shows an equivalent circuit in this condition. The current flowing through the coil L1 can be expressed by i(t)=VDD×t/L1, and therefore, becomes large in proportion to the input DC voltage VDD and the time "t".

Figure 10B:
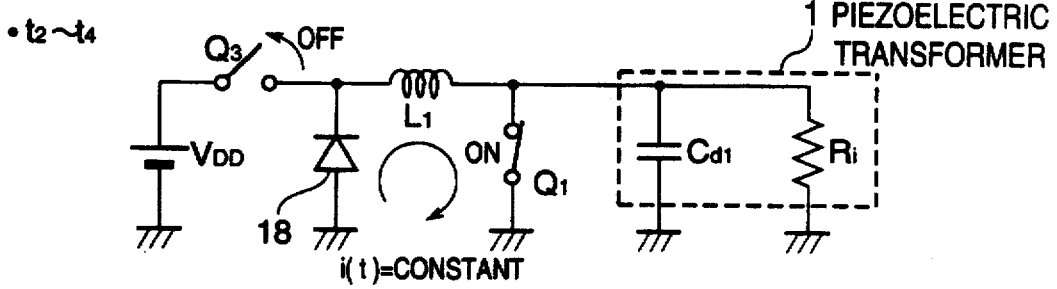

During a period from time $t_2$ to $t_4$ in which the voltage of the triangular wave fVCO becomes smaller than the rectified voltage Vc, the output signal Vg3 of the comparator 16 is brought to the high level, which turns off the transistor Q3, so that the coil L1 is separated from the power source, but a current is supplied from the ground through the diode 18, and therefore, the current iL1 of the level at the time $t_2$ continues to flow through the coil L1, as shown in FIG. 9G. FIG. 10B shows an equivalent circuit in this condition. The diode 18 operates as a circuit for maintaining the current of the coil L1, and the current i(t) flowing through the coil L1 is maintained at the value which flowed at the time $t_2$, so that the current continues to circulate through the ground, the diode 18, the coil L1 and the transistor Q1.

Figure 10C:
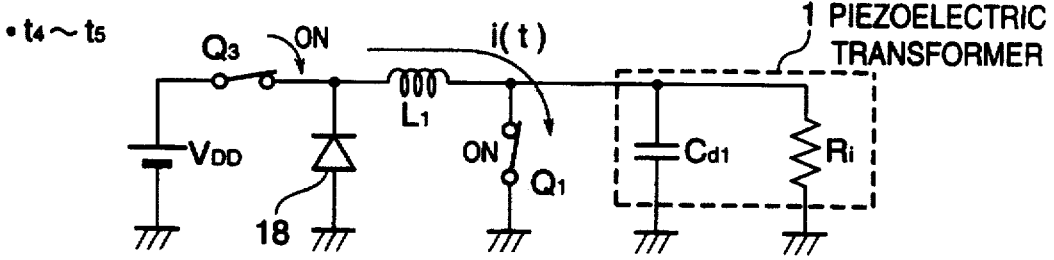

During a period from time $t_4$ to $t_5$ in which the voltage of the triangular wave fVCO becomes larger than the rectified voltage Vc again, the transistor Q3 is turned on, so that the current flowing through the coil L1 increases in proportion with the time and becomes a peak current value Ipeak at the time $t_5$. FIG. 10C shows an equivalent circuit in this condition.

Figure 10D:
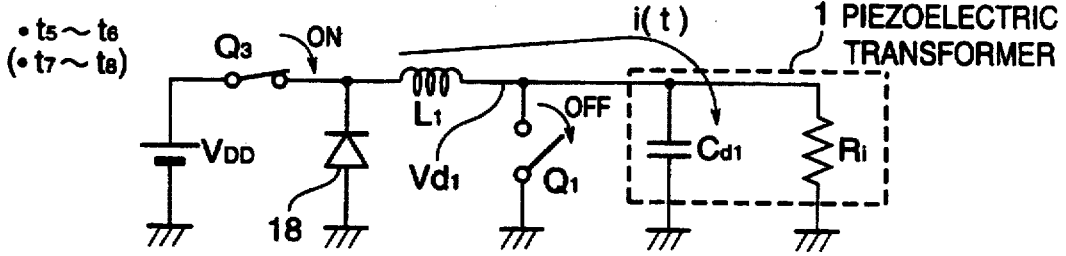

During a period from time $t_5$ to $t_6$, the transistor Q1 is turned off, 20 and the circuit becomes as an equivalent circuit shown in FIG. 10D. Thus, the coil L1 and an input equivalent capacitance Cd1 of the piezoelectric transformer 1 resonate, so that the drain voltage of the transistor Q1 becomes a half-wave sinusoidal voltage Vd1 as shown in FIG. 9E.

Figure 10E:
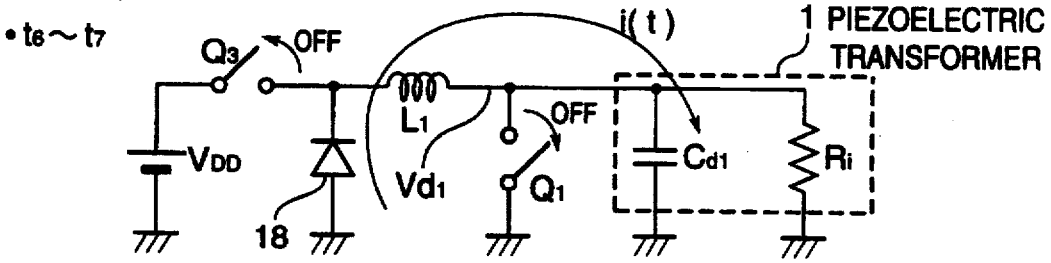

During a period from time $t_6$ to $t_7$, the voltage of the triangular wave fVCO becomes smaller than the rectified voltage Vc again, so that the transistor Q3 is turned off. Therefore, as shown in an equivalent circuit of FIG. 10E, an electric current discharged from the coil L1 flows through the diode 18, so that the peak voltage of the drain voltage of the transistor Q1 becomes about three times the input DC voltage VDD.

During a period from time $t_7$ to $t_8$, since the voltage of the triangular wave fVCO becomes larger than the rectified voltage Vc again, the transistor Q3 is turned on again. However, the current iL1 of the coil L1 becomes zero at the time $t_8$ as shown in FIG. 9G, because of an equivalent resistance of the load connected to the piezoelectric transformer. Thus, the current energy accumulated in the period of $t_1$ to $t_5$ has been discharged.

If the input DC voltage VDD elevates, the rectified voltage VC correspondingly increases, so that the high level period of the gate voltage Vg3, namely the OFF period of the transistor Q3, increases, with the result that the period for charging the current to the coils L1 and L2 becomes short.

With the above mentioned arrangement, if the input DC voltage VDD changes, the relative level of the rectified voltage VC to the triangular wave fVCO greatly changes, with the result that the on-off duty ratio of the transistor Q3 correspondingly changes to control the peak current charged to the coils at a constant level, whereby the drive voltage of the piezoelectric transformer is controlled to be maintained at a predetermined constant value.

As explained above, since the peak level of the drive voltages Vd1 and Vd2 of the piezoelectric transformer 1 do not vary independently of variation of the input DC voltage VDD, the frequency control circuit 3 shown in FIG. 6 generates the driving frequency which maintains the AC current IO(mArms) flowing through the load 2 (or the output AC voltage VO(Vrms) appearing on the load 2) at the predetermined constant level. This frequency control operation is the same as that of the example shown in FIG. 1. Since by action of the drive voltage control circuit 5 the drive voltage of the piezoelectric transformer 1 does not vary without being influenced by variation of the input DC voltage VDD, the step-up ratio of the piezoelectric transformer 1 can be maintained at a constant level independently of variation of the input DC voltage VDD, so that the piezoelectric transformer equivalently operates with a constant input DC voltage.

Therefore, the frequency control circuit 3 controls the step-up ratio of the piezoelectric transformer 1 to control the AC current IO(mArms) flowing through the load 2 (or the output AC voltage VO(Vrms) appearing on the load 2) at the predetermined constant level. Accordingly, the driving frequency can be maintained at a constant value even if the input DC voltage VDD varies.

The light adjusting circuit 6 is used when it is necessary to adjust the amount of light as in the case that a backlight of a cold-cathode fluorescent lamp is connected as the load 2. The light adjusting circuit 6 includes a triangular wave oscillator 19 for generating a triangular wave of a relatively low frequency (for example, 210 Hz) and a comparator 20 receiving at it one input an out-put of the triangular wave oscillator 19. A light adjusting voltage is supplied from an external to a second input of the comparator 20, so that the comparator 20 compares the voltage of the output of the triangular wave oscillator 19 with the externally supplied light adjusting voltage, to generate a pulse signal having a duty ratio which is changed in accordance with the externally supplied light adjusting voltage.

This pulse signal outputted from the comparator 20 is supplied to the integrating circuit 13 of the frequency control circuit 3 and the OR gate 16A of the drive voltage control circuit 5. During a period in which the pulse signal outputted from the comparator 20 is at a high level, the transistor Q3 in the drive voltage control circuit 5 is turned off so as to stop the supplying of the drive voltage to the piezoelectric transformer 1, and on the other hand, the integrating circuit 13 of the frequency control circuit 3 holds the output voltage of the integrating circuit 13 so that the driving frequency of the VCO 15 does not change.

Figure 11:
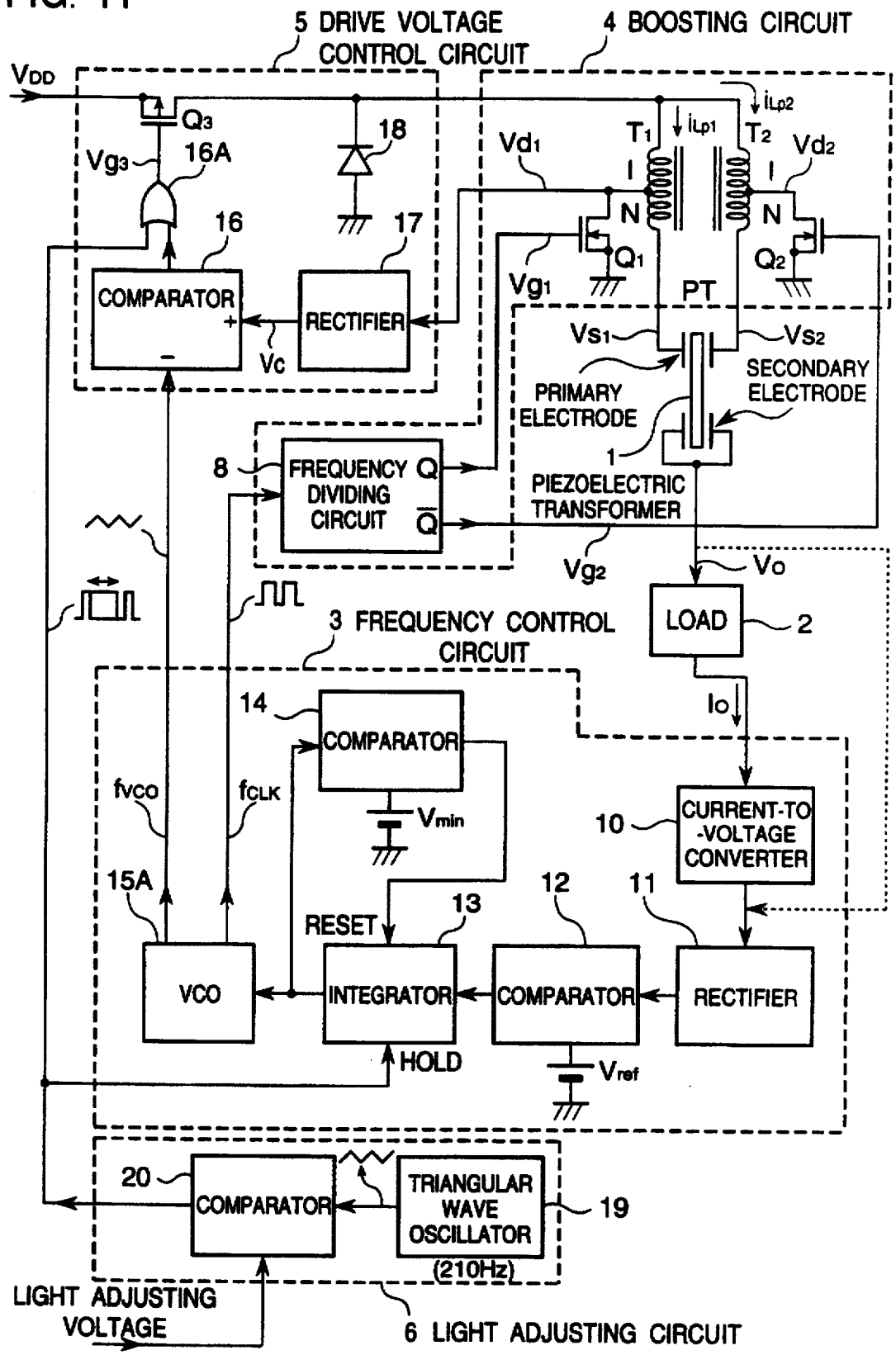
FIG. 11 is a block diagram of a second embodiment of the piezoelectric transformer driving circuit in accordance with the present invention.

Referring to FIG. 11, there is shown a block diagram of a second embodiment of the piezoelectric transformer driving circuit in accordance with the present invention. In FIG. 11, elements similar to those shown in FIG. 6 are given the same Reference Numerals, and explanation thereof will be omitted for simplification of description.

As seen from comparison between FIGS. 6 and 11, the second embodiment is the same inverter as that of the first embodiment, excepting that electromagnetic transformers T1 and T2 are substituted for the coils L1 and L2 in the first embodiment. In the second embodiment, the voltage resonant voltages Vd1 and Vd2 generated in the transistors Q1 and Q2, are stepped up by the secondary winding of the electromagnetic transformers T1 and T2 to voltages VS1 and VS2, respectively, which are turn-ratio "N+1" times of Vd1 and Vd2 and applied to the piezoelectric transformer 1. If the step-up ratio of the piezoelectric transformer 1 is not sufficient, shortage of the step-up ratio can be compensated by the electromagnetic transformers T1 and T2. Therefore, the second embodiment can be operated with a voltage lower than that required in the first embodiment.

Figure 12:
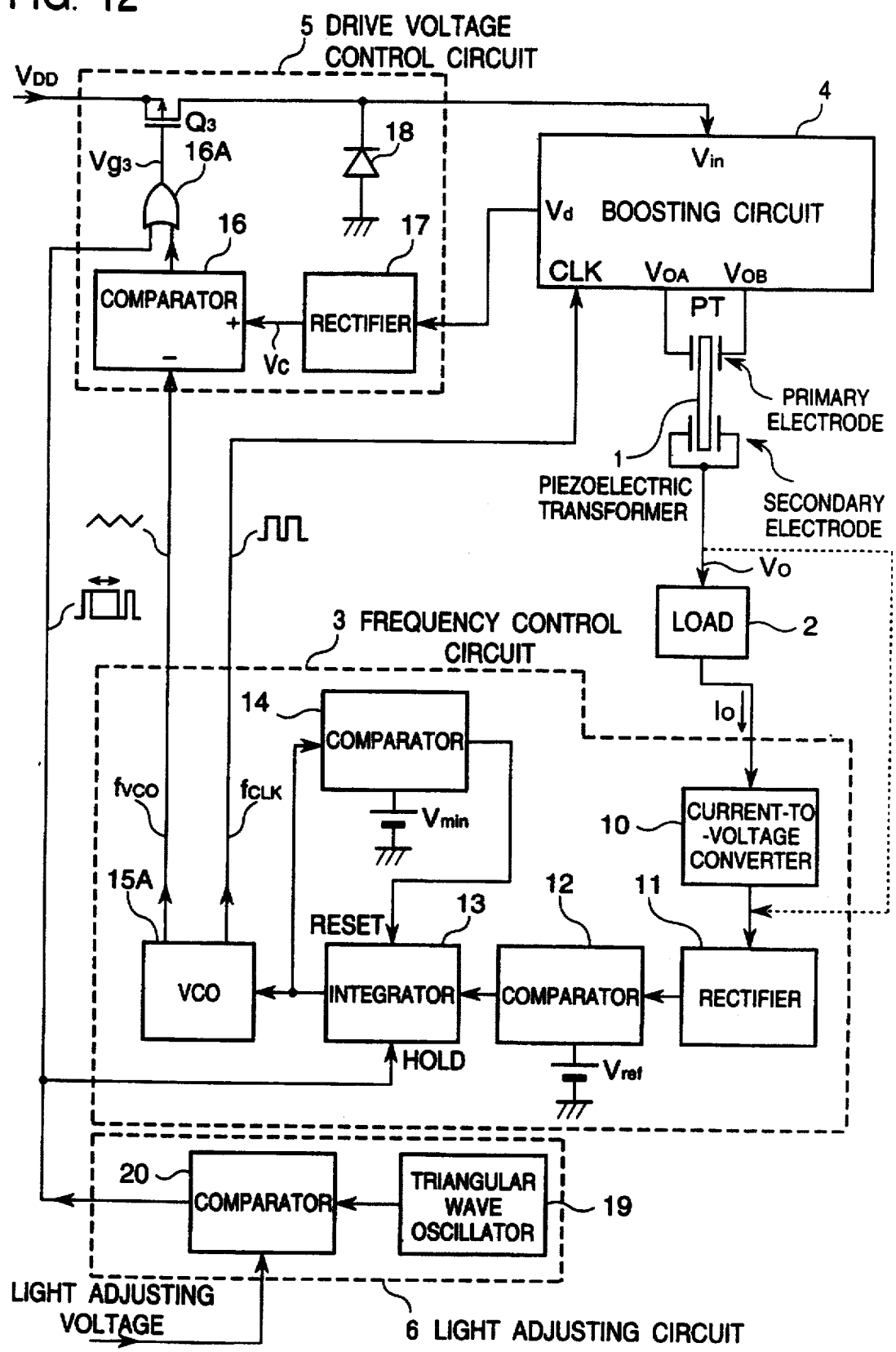
FIG. 12 is a block diagram of a third embodiment of the piezoelectric transformer driving circuit in accordance with the present invention.

Referring to FIG. 12, there is shown a block diagram of a third embodiment of the piezoelectric transformer driving circuit in accordance with the present invention in which the boosting circuit 4 is constituted of a one-transistor type voltage resonance (series resonance) convertor. In FIG. 12, elements similar to those shown in FIG. 6 are given the same Reference Numerals, and explanation thereof will be omitted for simplification of description. In particular, an overall operation of the third embodiment is substantially the same as that of the first embodiment, and therefore, the overall operation of the third embodiment will not be described.

Figure 13A:
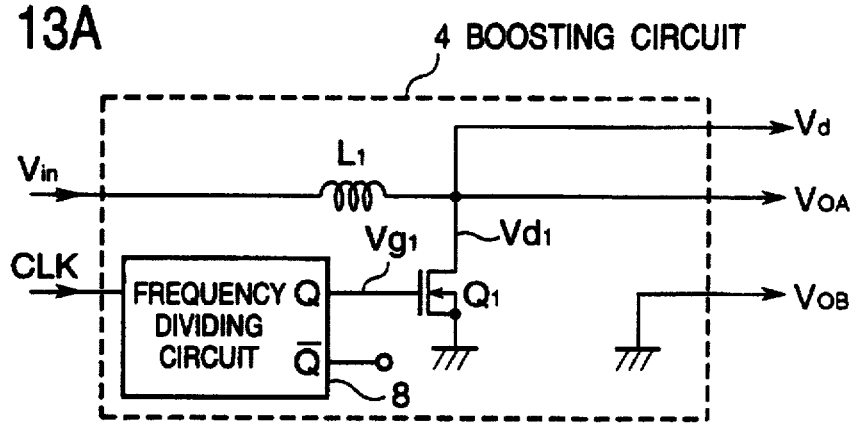
FIGS. 13A and 13B are circuit diagrams illustrating examples of the boosting circuit incorporated in the third embodiment of the piezoelectric transformer driving circuit shown in FIG. 12.
Figure 13B:
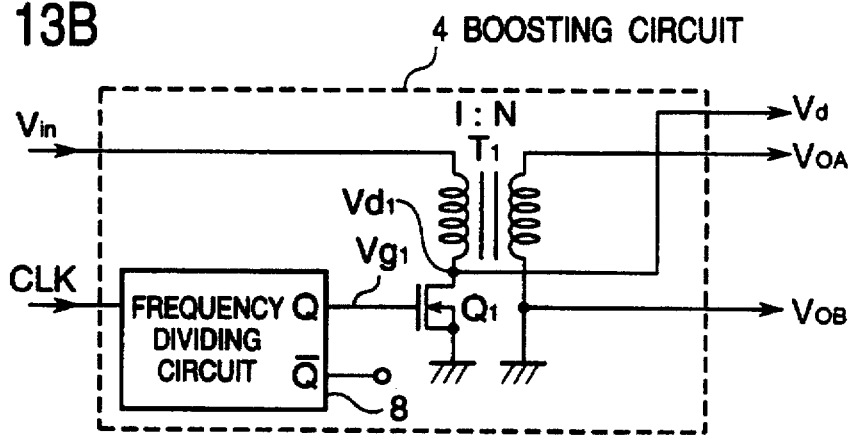
Figure 13C:
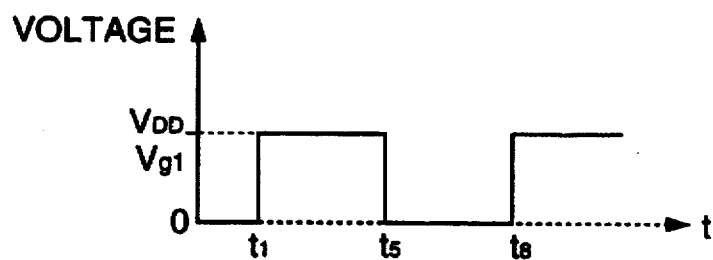
FIGS. 13C and 13D are timing charts illustrating an operation of the boosting circuits shown in FIGS. 13A and 14B.
Figure 13D:
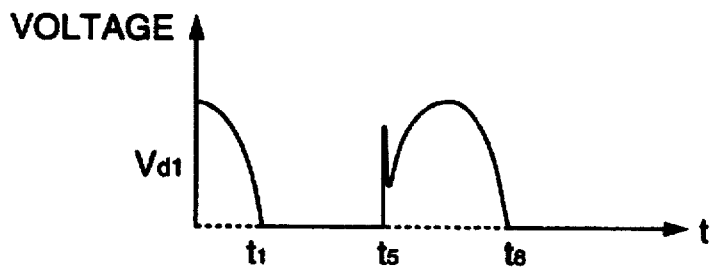
Figure 14A:
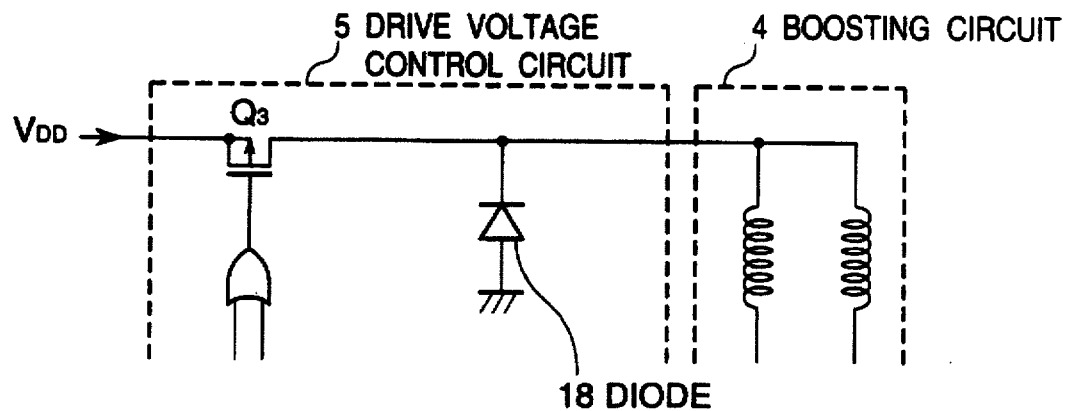
FIGS. 14A is a circuit diagram of one example of the current hold circuit which is incorporated in the piezoelectric transformer driving circuit and which is constructed to use a diode.
Figure 14B:
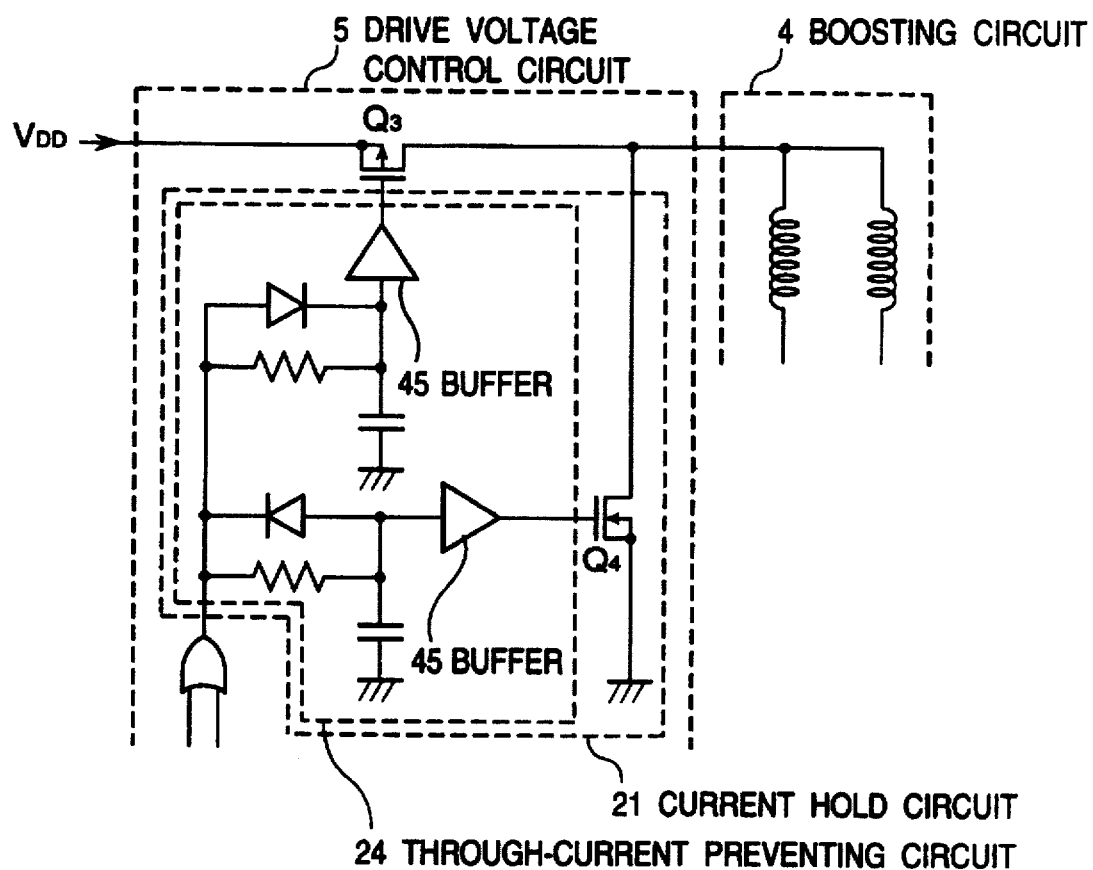
FIGS. 14B is a circuit diagram of one example of the current hold circuit which is incorporated in the piezoelectric transformer driving circuit but which is constructed to use a transistor.

FIGS. 13A and 14B are circuit diagrams of examples of the boosting circuit 4 incorporated in the third embodiment of the piezoelectric transformer driving circuit shown in FIG. 12, and FIGS. 13C and 13D are timing charts illustrating an operation of the boosting circuits shown in FIGS. 13A and 14B.

The boosting circuit 4 shown in FIG. 13A includes one coil L1 having one end connected to receive the input DC voltage Vin and the other end which is connected at a terminal VOA to one of a pair of primary electrodes of the piezoelectric transformer 1, and which is also connected through a terminal Vd to the rectifying circuit 17. The other of the pair of primary electrodes of the piezoelectric transformer 1 is grounded through a terminal VOB. The other end of the coil L1 is grounded through the transistor Q1 which is controlled by the frequency dividing circuit 8, similarly to the first embodiment. Thus, a voltage resonance (series resonance) circuit is constituted of the coil L1 and an equivalent input capacitance of the piezoelectric transformer 1, so as to drive the piezoelectric transformer with a half-wave sine wave.

The driving gate voltage Vg1 of the transistor Q1 is supplied with the driving frequency from the 2-phase frequency dividing circuit 8 (which frequency-divides the driving frequency fCLK generated in the VCO 15A) as shown in FIG. 13C, so that the transistor Q1 is turned on at a timing 18 where the drain voltage Vd1 becomes zero as shown in FIG. 13D in the voltage resonance (series resonance) circuit constituted of the coil L1 and the input capacitance of the piezoelectric transformer 1 (Zero Voltage Switching (ZVS)). Therefore, the current flowing through the coil L1 is controlled by the drive voltage control circuit 5, similarly to the first embodiment. Accordingly, even if the input DC voltage range is wide, since the peak value of the current charged into the coil L1 is controlled at a predetermined value, the piezoelectric transformer can be caused to operate without variation in efficiency, similarly to the first and second embodiments shown in FIGS. 6 and 11.

The boosting circuit 4 shown in FIG. 13B includes an electromagnetic transformer T1 having a turn-ratio of 1 :N and having a primary winding having one end connected to receive the input DC voltage Vin and the other end grounded through the transistor Q1 which is controlled by the frequency dividing circuit 8, similarly to the first embodiment. The other end of the primary winding is also connected through a terminal Vd to the rectifying circuit 17. One end of a secondary winding of the electromagnetic transformer T1 is connected at a terminal VOA to one of a pair of primary electrodes of the piezoelectric transformer 1, and the other end of the secondary winding is grounded. The other of the pair of primary electrodes of the piezoelectric transformer 1 is grounded through a terminal VOB.

In this example shown in FIG. 13B, Vd1 is stepped up by the turn-ratio of 1:N, and the stepped-up voltage drives the piezoelectric transformer 1. Therefore, a shortage of the step-up ratio of the piezoelectric transformer is compensated by the electromagnetic transformer T1. On the other hand, a primary winding inductance and a secondary winding inductance of the electromagnetic transformer T1 are set to realize the zero voltage switching (ZVS) similarly to the example shown in FIG. 13A. In the examples shown in FIGS. 12, 13A and 13B, since the piezoelectric transformer 1 is driven with a half-wave sine wave having some degree of higher harmonic components, the efficiency lowers by some degree, but on the other hand, the number of circuit elements can be reduced.

All of the above mentioned embodiments are the inverters in which the AC voltage outputted from the secondary electrodes of the piezoelectric transformer 1 is applied to the load as it is. However, in order to use the embodiments as a DC-to-DC converter, a rectifying circuit is inserted between the secondary electrodes of the piezoelectric transformer 1 and the load 2. In this case, it would be apparent to averaged persons skilled in the art that the operation of the piezoelectric transformer driving circuit is the same as those of the above mentioned embodiments.

In addition, in the case of controlling the AC voltage VO(Vrms) applied to the load at a constant value, the AC voltage VO(Vrms) is directly supplied to the rectifying circuit 11 by omitting the current-to-voltage converter 10. With this modification, the shown embodiments can operates as the inverter having a regulated constant output voltage.

The embodiments shown in FIGS. 6, 11 and 12 are so constructed that, when the transistor Q3 is turned off, the current flowing through the coil L1 or L2 or the magnetic transformer T1 or T2 is maintained by means of the diode 18 as shown in FIG. 14A. However, the diode 18 can be replaced with an N-channel MOS transistor Q4 connected between the source of the transistor Q3 and the ground, as shown in FIG. 14B, so that when the transistor Q3 is turned off, the current flowing through the coil L1 or L2 or the magnetic transformer T1 or T2 is maintained by means of the transistor Q4. In this case, in order to prevent a through-current from flowing through the transistors Q3 and Q4, a through-current preventing circuit 24 is used, which is constructed as shown in FIG. 14B, to turn on the transistor Q4 after the transistor Q3 becomes completely off, so that the transistors Q3 and Q4 are never simultaneously put in an on condition.

As seen from the above, the piezoelectric transformer driving circuit in accordance with the present invention is characterized by having the drive voltage control circuit 5, which operates to control the AC voltage applied to the piezoelectric transformer 1 at a predetermined constant value, regardless of variation of the input DC voltage VDD, so that the driving frequency of the piezoelectric transformer 1 does not separate from the resonance frequency fr. Therefore, the piezoelectric transformer 1 can be driven with the driving frequency realizing a maximum efficiency, while satisfying the condition for the zero voltage switching (ZVS). It was confirmed that the piezoelectric transformer driving circuit in accordance with the present invention stably operates within an input voltage range which is about four times the minimum input voltage. Thus, the piezoelectric transformer driving circuit having a wide input voltage range can be provided in accordance with the present invention.

Furthermore, even if the input DC voltage VDD becomes the maximum voltage, the peak value of the current flowing through the coil L1 or L2 or through the primary winding of the transformer T1 or T2 is controlled at the same current value as that when the input DC voltage VDD is the minimum voltage. Accordingly, since the current value causing the magnetic saturation can be designed to correspond to the minimum input DC voltage, a small-sized coil or electromagnetic transformer can be used, so that there can be realized a driving circuit suitable to a thinness and a small size of the piezoelectric transformer.

Furthermore, since the peak level of the drain voltage of the transistors Q1 and Q2 can be controlled at a constant value by action of the drive voltage control circuit 5 even if the input DC voltage VDD varies, the necessary breakdown voltage of the transistors can be lowered, and therefore, the on-resistance of the transistors can be reduced so as to improve the efficiency and the manufacturing cost can be also reduced.

In addition, in the piezoelectric transformer driving circuit having the one-transistor type boosting circuit 5 as shown in FIGS. 12, 13A and 13B, the piezoelectric transformer can be driven with a simple circuit within a wide input voltage range.

In the case of using the piezoelectric transformer driving circuit in accordance with the present invention as the inverter for a backlight and to perform the burst light adjustment, since an open-circuiting of the inductor can be prevented by the diode 18, the drain voltage of the transistors Q1 and Q2 never become a high voltage, and therefore, a high voltage protection element such as a Zener diode becomes unnecessary. In this point, the manufacturing cost can also be reduced.

The invention has thus been shown and described with reference to the specific embodiments. However, it should be noted that the present invention is in no way limited to the details of the illustrated structures but changes and modifications may be made within the scope of the appended claims.

I claim:

1. A piezoelectric transformer driving circuit comprising:
 a piezoelectric transformer having a pair of primary electrodes and a pair of secondary electrodes so that when an AC voltage is applied between said pair of primary electrodes, a stepped-up AC voltage is generated between said pair of secondary electrodes;
 a first coil and a first transistor each connected at its one end to a first primary electrode of said pair of primary electrodes;
 a second coil and a second transistor each connected at its one end to a second primary electrode of said pair of primary electrodes;
 a boosting circuit having a frequency dividing circuit for alternately driving said first transistor and said second transistor;
 a third transistor having one end connected to receive an input DC voltage and the other end connected to the other end of each of said first coil and said second coil;
 a current maintaining means connected to the other end of each of said first coil and said second coil;
 a drive voltage control means for turning off said third transistor in accordance with a variable duty ratio signal during an on-period of each of said first and second transistors, thereby to control a drive voltage applied to said primary electrodes of said piezoelectric transformer at a predetermined voltage; and
 a frequency control means for changing a driving frequency supplied to said first and second transistors, to control a step-up ratio of said piezoelectric transformer so that an output voltage of a predetermined magnitude can be obtained from said pair of secondary electrodes of said piezoelectric transformer.

2. A piezoelectric transformer driving circuit claimed in claim 1 wherein said current maintaining means is formed of a diode having an anode-grounded diode having a cathode connected to the other end of each of said first coil and said second coil.

3. A piezoelectric transformer driving circuit claimed in claim 1 wherein said current maintaining means is formed of a fourth transistor connected between the ground and the other end of each of said first coil and said second coil, said fourth transistor and said third transistor being turned on exclusively to each other.

4. A piezoelectric transformer driving circuit claimed in claim 1, further including means for selectively turning off said third transistor in a time-division manner so as to stop the input voltage applied to said piezoelectric transformer, thereby to change an effective value of the AC current or voltage supplied to a load connected to said secondary electrodes of said piezoelectric transformer.

5. A piezoelectric transformer driving circuit claimed in claim 1 wherein said frequency control means includes detecting means for detecting the AC voltage or current supplied from said piezoelectric transformer to a load connected to said secondary electrodes of said piezoelectric transformer, and a triangular wave generating means for generating, on the basis of an output of said detecting means, a triangular wave having a variable frequency in accordance with said output of said detecting means, and wherein said drive voltage control means including a rectifying means connected to said one end of one of said first and second coils, and a comparing means for comparing a rectified voltage outputted from said rectifying means and said triangular wave outputted from said triangular wave generating means, to generate said variable duty ratio signal when said rectified voltage is higher than a voltage of said triangular wave.

6. A piezoelectric transformer driving circuit comprising:
a piezoelectric transformer having a pair of primary electrodes and a pair of secondary electrodes so that when an AC voltage is applied between said pair of primary electrodes, a stepped-up AC voltage is generated between said pair of secondary electrodes;

a first autotransformer having a secondary terminal connected to a first primary electrode of said pair of primary electrodes and an intermediate tap connected to one end of a first transistor;

a second autotransformer having a secondary terminal connected to a second primary electrode of said pair of primary electrodes and an intermediate tap connected to one end of a second transistor;

a boosting circuit having a frequency dividing circuit for alternately driving said first transistor and said second transistor;

a third transistor having one end connected to receive an input DC voltage and the other end connected to a primary terminal of each of said first autotransformer and said second autotransformer;

a current maintaining means connected to said primary terminal of each of said first autotransformer and said second autotransformer;

a drive voltage control means for turning off said third transistor in accordance with a variable duty ratio signal during an on-period of each of said first and second transistors, thereby to control a drive voltage applied to said primary electrodes of said piezoelectric transformer at a predetermined voltage; and a frequency control means for changing a driving frequency supplied to said first and second transistors, to control a step-up ratio of said piezoelectric transformer so that an output voltage of a predetermined magnitude can be obtained from said pair of secondary electrodes of said piezoelectric transformer.

7. A piezoelectric transformer driving circuit claimed in claim 6 wherein said current maintaining means is formed of a diode having an anode-grounded diode having a cathode connected to said primary terminal of each of said first autotransformer and said second autotransformer.

8. A piezoelectric transformer driving circuit claimed in claim 6 wherein said current maintaining means is formed of a fourth transistor connected between the ground and said primary terminal of each of said first autotransformer and said second autotransformer, said fourth transistor and said third transistor being turned on exclusively to each other.

9. A piezoelectric transformer driving circuit claimed in claim 6, further including means for selectively turning off said third transistor in a time-division manner so as to stop the input voltage applied to said piezoelectric transformer, thereby to change an effective value of the AC current or voltage supplied to a load connected to said secondary electrodes of said piezoelectric transformer.

10. A piezoelectric transformer driving circuit claimed in claim 6 wherein said frequency control means includes detecting means for detecting the AC voltage or current supplied from said piezoelectric transformer to a load connected to said secondary electrodes of said piezoelectric transformer, and a triangular wave generating means for generating, on the basis of an output of said detecting means, a triangular wave having a variable frequency in accordance with said output of said detecting means, and wherein said drive voltage control means including a rectifying means connected to said intermediate tap of one of said first and second autotransformers, and a comparing means for comparing a rectified voltage outputted from said rectifying means and said triangular wave outputted from said triangular wave generating means, to generate said variable duty ratio signal when said rectified voltage is higher than a voltage of said triangular wave.

11. A piezoelectric transformer driving circuit comprising:
a piezoelectric transformer having a primary electrode side and a secondary electrode side so that when an AC voltage is applied to said primary electrode side, a stepped-up AC voltage is generated at said secondary electrode side;

a boosting means having a coil connected to receive at its one end a DC voltage and a first transistor connected to the other end of said coil, said boosting means selectively turning on said first transistor within each one driving period for said piezoelectric transformer so that a current energy is supplied to said coil from said input DC voltage, and then, selectively turning off said first transistor so that an electric energy accumulated in said coil is supplied as a voltage energy to said secondary electrode side of said piezoelectric transformer;

drive voltage control means including a second transistor and a current maintaining means for maintaining a current flowing through said coil, each of said second transistor and said current maintaining means being connected to said one end of said coil, said drive voltage control means turning on and off said second transistor within said each one driving period for said piezoelectric transformer and within a period in which said first transistor is on, thereby to change a duty ratio of an operation of said current maintaining means, for controlling a drive voltage applied to said piezoelectric transformer at a predetermined level; and a frequency control means for changing a driving frequency supplied to said boosting means, to control a step-up ratio of said piezoelectric transformer so that an output voltage of a predetermined magnitude can be obtained from said secondary electrode side of said piezoelectric transformer.

12. A piezoelectric transformer driving circuit claimed in claim 11 wherein said current maintaining means is formed of a diode having an anode-grounded diode having a cathode connected to said one end of said coil.

13. A piezoelectric transformer driving circuit claimed in claim 11 wherein said current maintaining means is formed of a third transistor connected between the ground and said one end of said coil and said second autotransformer, said second transistor and said third transistor being turned on exclusively to each other.

14. A piezoelectric transformer driving circuit claimed in claim 11, further including means for selectively turning off said second transistor in a time-division manner so as to stop the input voltage applied to said piezoelectric transformer, thereby to change an effective value of the AC current or voltage supplied to a load connected to said secondary electrodes of said piezoelectric transformer.

15. A piezoelectric transformer driving circuit chimed in claim 11 wherein said frequency control means includes detecting means for detecting the AC voltage or current supplied from said piezoelectric transformer to a load connected to said secondary electrodes of said piezoelectric transformer, and a triangular wave generating means for generating, on the basis of an output of said detecting means, a triangular wave having a variable frequency in accordance with said output of said detecting means, and wherein said drive voltage control means including a rectifying means connected to said one end of said coil, and a comparing means for comparing a rectified voltage outputted from said rectifying means and said triangular wave outputted from said triangular wave generating means, to generate said variable duty ratio signal when said rectified voltage is higher than a voltage of said triangular wave.

16. A piezoelectric transformer driving circuit claimed in claim 11 wherein said boosting means includes a secondary coil magnetically coupled to said first named coil, and said secondary coil being connected to said secondary electrode side of said piezoelectric transformer so that an elevated voltage is applied from said secondary coil to said secondary electrode side of said piezoelectric transformer.

17. A piezoelectric transformer driving circuit claimed in claim 16 wherein said current maintaining means is formed of a diode having an anode-grounded diode having a cathode connected to said one end of said first named coil.

18. A piezoelectric transformer driving circuit claimed in claim 16 wherein said current maintaining means is formed of a third transistor connected between the ground and said one end of said first named coil, said second transistor and said third transistor being turned on exclusively to each other.

19. A piezoelectric transformer driving circuit claimed in claim 16, further including means for selectively turning off said second transistor in a time-division manner so as to stop the input voltage applied to said piezoelectric transformer, thereby to change an effective value of the AC current or voltage supplied to a load connected to said secondary electrodes of said piezoelectric transformer.

20. A piezoelectric transformer driving circuit claimed in claim 16 wherein said frequency control means includes detecting means for detecting the AC voltage or current supplied from said piezoelectric transformer to a load connected to said secondary electrodes of said piezoelectric transformer, and a triangular wave generating means for generating, on the basis of an output of said detecting means, a triangular wave having a variable frequency in accordance with said output of said detecting means, and wherein said drive voltage control means including a rectifying means connected to said one end of said first named coil, and a comparing means for comparing a rectified voltage outputted from said rectifying means and said triangular wave outputted from said triangular wave generating means, to generate said variable duty ratio signal when said rectified voltage is higher than a voltage of said triangular wave.

\* \* \* \* \*

UNITED STATES PATENT AND TRADEMARK OFFICE
CERTIFICATE OF CORRECTION

PATENT NO. : 5,705,877
DATED : January 6, 1998
INVENTOR(S) : Yasuhei Shimada

It is certified that error appears in the above-identified patent and that said Letters Patent is hereby corrected as shown below:

Col. 15, line 23, change "haft" to --half--.

Col. 18, line 9, delete "20".

Col. 20, line 16, change $t_8$ to --t8--.

Signed and Sealed this

Fourth Day of May, 1999

Q. TODD DICKINSON

Attest:

Attesting Officer

Acting Commissioner of Patents and Trademarks